United States Patent [19]

Mahmood et al.

[11] Patent Number: 5,726,902
[45] Date of Patent: Mar. 10, 1998

[54] METHOD AND APPARATUS FOR CHARACTERIZING TIMING BEHAVIOR OF DATAPATHS FOR INTEGRATED CIRCUIT DESIGN AND FABRICATION

[75] Inventors: Mossaddeq Mahmood, San Jose; Mandalagiri Chandrasekhar, Cupertino, both of Calif.; Arnold Ginetti, Antibe, France; Balmukund K. Sharma, Santa Clara, Calif.

[73] Assignee: VLSI Technology, Inc., San Jose, Calif.

[21] Appl. No.: 482,267

[22] Filed: Jun. 7, 1995

[51] Int. Cl.$^6$ .................................................. G06F 17/50
[52] U.S. Cl. ............................................ 364/489; 364/490
[58] Field of Search ............................. 395/800; 364/489, 364/491, 490

[56] References Cited

U.S. PATENT DOCUMENTS

| | | | |
|---|---|---|---|
| 5,197,015 | 3/1993 | Hartoog et al. | 364/490 |
| 5,258,919 | 11/1993 | Yamanouchi et al. | 364/489 |
| 5,282,148 | 1/1994 | Poirot et al. | 364/491 |
| 5,311,443 | 5/1994 | Crain et al. | 364/491 |
| 5,396,435 | 3/1995 | Ginetti | 364/489 |
| 5,426,591 | 6/1995 | Ginetti et al. | 364/489 |
| 5,487,018 | 1/1996 | Loos | 364/489 |
| 5,491,640 | 2/1996 | Sharma | 364/488 |
| 5,519,627 | 5/1996 | Mahmood | 364/488 |
| 5,521,837 | 5/1996 | Frankle | 364/491 |
| 5,541,850 | 7/1996 | Vander Zanden | 364/491 |
| 5,572,436 | 11/1996 | Dangelo | 364/489 |

Primary Examiner—Eric Coleman
Attorney, Agent, or Firm—Hickman Beyer & Weaver

[57] ABSTRACT

A method and apparatus for characterizing the timing behavior of datapath in integrated circuit design and fabrication. A set of circuit specifications for an integrated circuit are developed and described in a hardware description language (HDL) description. A datapath library including datapath cells and a gate library including primitive gate cells are provided, and a netlist is synthesized from the HDL description. The netlist is composed of datapath cells from the datapath library and primitive gate cells from the gate library. If a datapath cell instance in the netlist does not meet the timing constraints imposed by a user for the circuit, an alternative datapath cell instance can be substituted for that cell instance in a resynthesis and optimization step. An integrated circuit is preferably fabricated as specified by the resynthesized netlist. The netlist is preferably resynthesized multiple times in an iterative loop to optimize the netlist according to the constraints. The timing information for alternative cells used in the resynthesis of the netlist can be retrieved from a timing database in one embodiment. Timing information for datapath cells is stored in the timing database in a pre-characterization process, and the location of the timing information in the timing database is stored in a query database. In another embodiment, timing information for alternative datapath cells is calculated dynamically during the resynthesis process for optimizing the timing of a netlist.

37 Claims, 10 Drawing Sheets

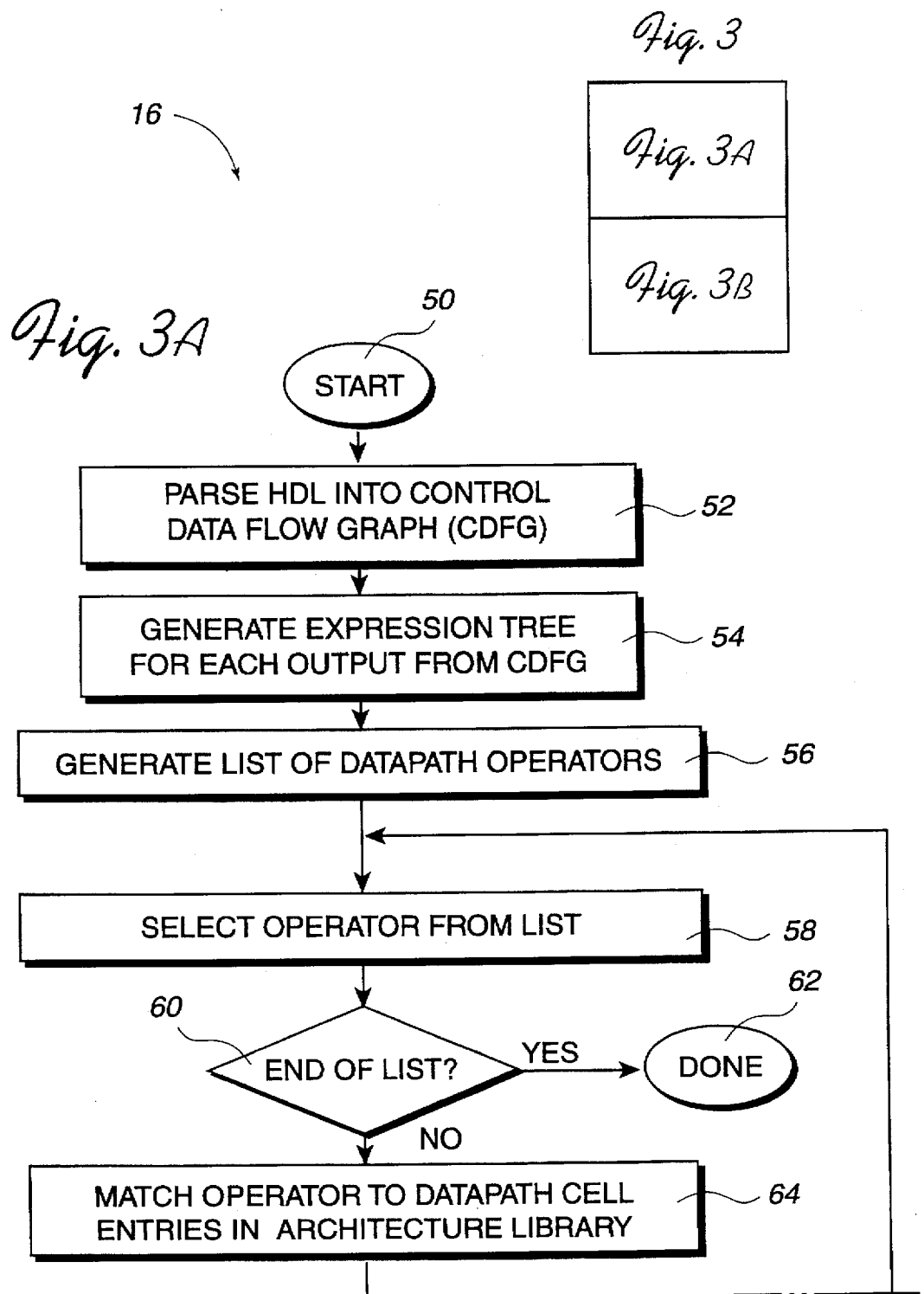

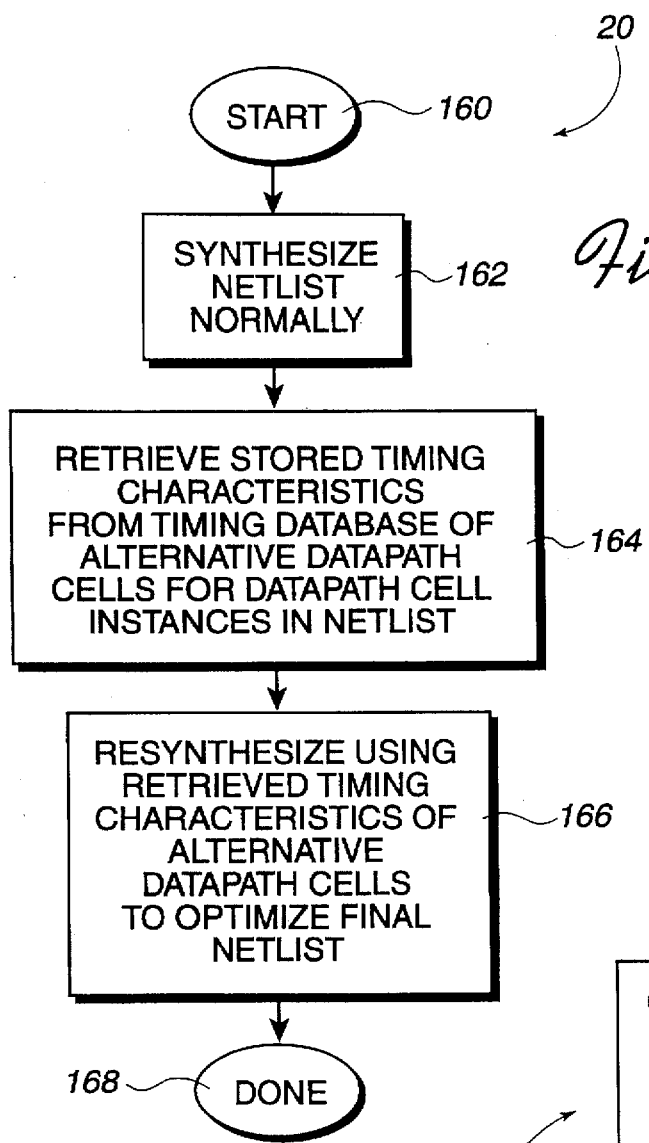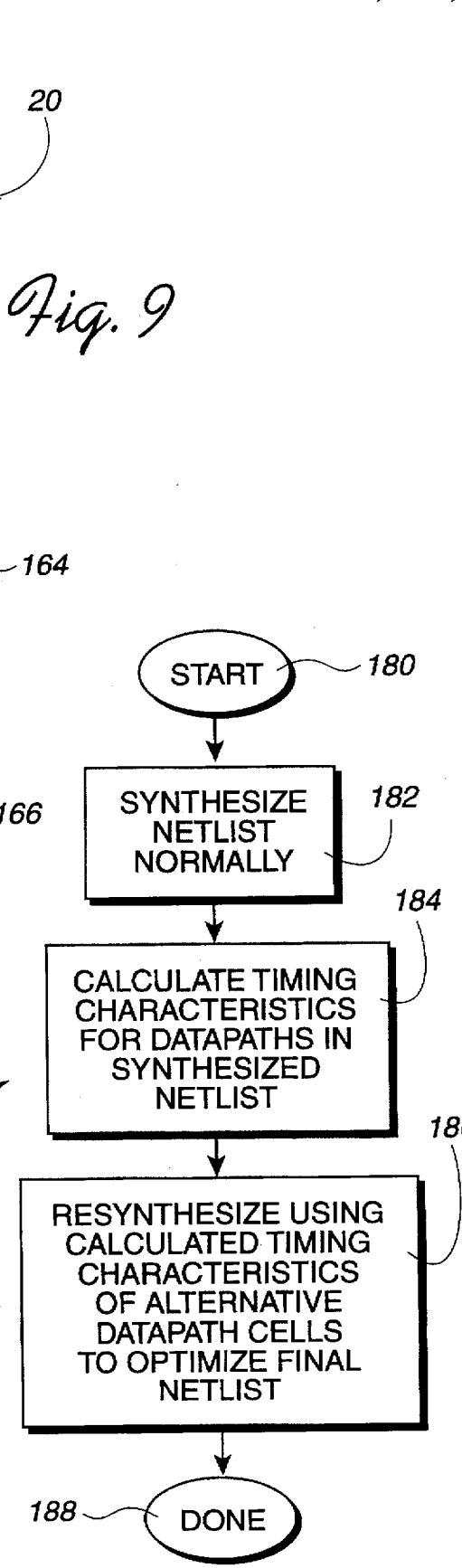

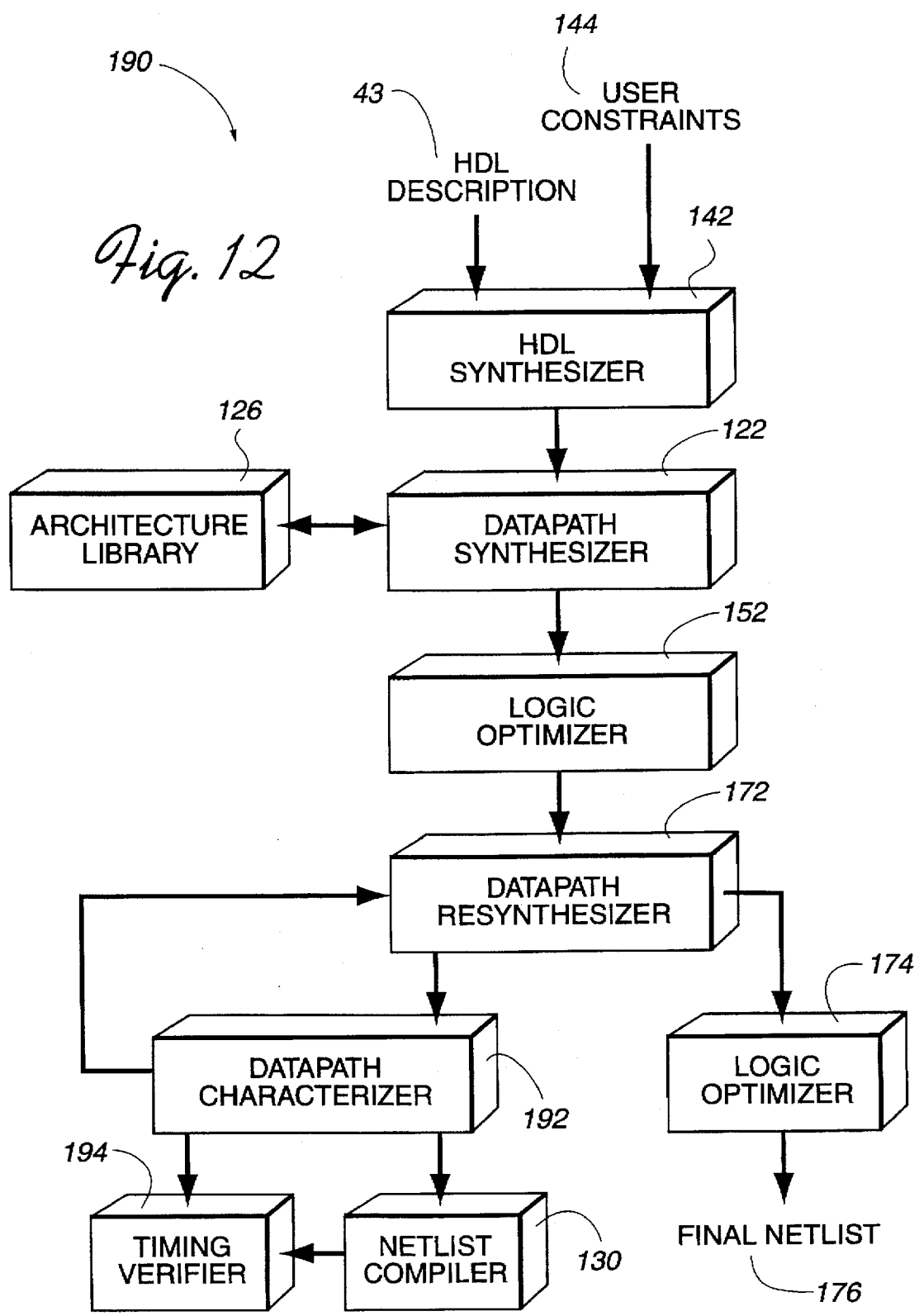

METHOD AND APPARATUS FOR CHARACTERIZING TIMING BEHAVIOR OF DATAPATHS FOR INTEGRATED CIRCUIT DESIGN AND FABRICATION

BACKGROUND OF THE INVENTION

The present invention relates generally to synthesis of integrated circuits and more particularly to characterizing timing information of datapaths in the design and fabrication of integrated circuits.

The development of the integrated circuit (IC) chip has been integral to the improvement and advancement of many industries. As the complexity and functionality of these ICs has increased, their incorporation into a variety of products has likewise increased. While in some situations, a designer is able to use standard ICs for a desired application, in other situations standard chips are unable to meet the precise needs of a designer. In such situations, designers often turn to designing an application specific integrated circuit (ASIC).

ASICs allow a designer to design a circuit with specifications and functionality closely tailored to their desired product application, without having to conform their product to the feature and performance limits of a standard chip. Typically, ASIC production begins with a set of circuit specifications. This design is then written in a hardware description language (HDL), such as VHDL, an IEEE standard. The description is then "synthesized", i.e., a computer program uses the set of circuit specifications encoded in an HDL to design the circuitry of the IC. Next, the behavior of the circuit is verified and, ultimately, a circuit layout is created. From the layout, a mask is formed and used for the IC chip (ASIC) production.

The behavioral description of the specified circuit is divided into two distinct parts: datapath logic and random ("control") logic. The random logic is implemented using primitive gate cells from a gate library (for example a standard cell or gate array library) using a logic synthesizer. The datapath logic is optimally synthesized by a datapath synthesizer using datapath components ("cells") from a datapath library. Datapath logic corresponds to portions of the design that describe operations such as addition, subtraction, and comparison. These operations, for example, can operate on buses in a circuit design. Datapath operations are implemented using the datapath cells, and the datapath cells can be implemented using primitive or "leaf level" cells from a library. The datapath synthesizer typically converts the datapath part of an HDL circuit specification into a datapath netlist.

The problem encountered is how to optimally synthesize an IC from an HDL specification, specifically using the timing of datapath cells in synthesized circuits. If the timing characteristics of components in a circuit design are known, a circuit having optimally short signal delays can be created. Timing characteristics of primitive cells are available from data books and other references. However, timing characteristics for datapath cells are not available. Although accurate timing characteristics of the primitive cells which make up the datapath cells are known, the timing of the datapath cells cannot be easily determined from the primitive cells, since the datapath cells comprise a complex arrangement of different types of primitive cells.

Previously, circuits were synthesized and optimized at the gate level using timing characteristics of the primitive cells. This approach does not analyze the tradeoff for different datapath architectures since the datapath cell timing characteristics for different architectures were not available. Optimal datapath cells have thus not been provided for synthesized circuits. Therefore, what is needed is a method and apparatus for determining the timing characteristics of datapath cells and providing these characteristics to a designer or other tools and processes for optimizing the timing of a circuit.

SUMMARY OF THE INVENTION

The present invention includes a method and apparatus for characterizing the timing behavior of datapath cells. This permits datapaths of a designed circuit to be optimized to a greater degree than was previously possible. For example, if a datapath cell instance does not meet timing constraints imposed by a user on a circuit, an alternative datapath cell instance can be substituted for that cell instance. The timing characteristics of the alternative datapath cell is known using the present invention, allowing better optimization of integrated circuits.

More particularly, a method in accordance with the present invention for fabricating an integrated circuit includes steps of developing a set of circuit specifications for an integrated circuit, describing the set of circuit specifications in a hardware description language (HDL), and inputting the hardware description language description into a digital computer. A datapath library including datapath cells is provided, and a netlist is synthesized from the HDL description on the computer. The netlist is composed of datapath cells from the datapath library. The netlist is then resynthesized and optimized according to timing information describing timing characteristics of alternative datapath cells. An integrated circuit is preferably fabricated as specified by the resynthesized netlist. The step of resynthesizing and optimizing the netlist is preferably accomplished multiple times in an iterative loop to optimize the netlist according to constraints. Preferably, IC mask specifications are produced based upon the resynthesized netlist, multiple IC masks are produced from the mask specifications, and the IC masks are used to fabricate the integrated circuit.

The timing information used in the resynthesis of the netlist can preferably be provided in different ways. In one embodiment, the timing information for the datapath cells is retrieved from a timing database. In a pre-characterization process, netlists for datapath cells from the datapath library are synthesized by analyzing the circuit's HDL description. Datapath operators in the circuit's HDL description are matched to datapath cells stored in the datapath library. The timing information for each of the matched datapath cells is determined and stored in a timing database to be accessed during later synthesis of the circuit. In the pre-characterization process, an indication is preferably stored in a query database indicating whether timing information of a datapath cell has been stored in the timing database. The indication includes a record having an identification of the datapath cell and a location in the timing database where the timing information is stored. The pre-characterization process checks for a record in the query database for a datapath cell with the appropriate compilation parameter values, such that when a record for a datapath cell with matched compilation parameter values is found in the query database, the timing information for that datapath cell is not calculated and stored in the timing database. The pre-characterization process also includes a step of compiling a datapath netlist before the step of calculating that datapath's timing information. The query database is preferably updated with records indicating that timing characteristics for appropriate datapath cells including the compilation parameter values have been stored in the timing database. In alternate embodiments, the timing and query databases can be accessed by other processes besides the synthesis of an integrated circuit.

In another embodiment of the present invention, timing characteristics for a datapath cell are computed dynamically during the synthesis process. The timing information is calculated by compiling the netlists for each of the datapath cells with the appropriate compilation parameter values. The timing characteristics are used in the resynthesizing and optimizing step. Each datapath operator in the HDL description is synthesized into a netlist and its timing characteristics are then calculated. The timing characteristics are immediately used in the resynthesis and optimization step, so that no timing or query databases are required to store the timing information.

An apparatus in accordance with the present invention includes a datapath synthesizer for retrieving datapath operators from an input HDL description of a circuit and synthesizing a datapath netlist. An architecture library (or datapath library) provides datapath cells to the datapath synthesizer for implementing the datapath operators. A datapath characterizer provides timing characteristics of the datapath cells, and a datapath resynthesizer resynthesizes the netlist into a final netlist according to the timing characteristics of alternative datapath cells that replace datapath cell instances in the netlist. This process improves the timing performance of the final netlist for the circuit. The final netlist is preferably used in fabrication of an integrated circuit.

In one embodiment, a pre-characterizer is used for storing timing information of the datapath cells with appropriate compilation parameter values. The pre-characterizer includes the datapath characterizer, a timing verifier for determining the timing characteristics of the datapath cells, and a timing database for storing the timing characteristics. A netlist compiler, such as a datapath compiler or architecture compiler, is included in the pre-characterizer for compiling the datapath netlists and providing the compiled datapath netlists to the timing verifier. A query database is included in the pre-characterizer for storing a record indicating whether timing information for each of the datapath cells has been stored in the timing database, and, if stored, the location of the timing information in the timing database.

In an alternate embodiment, no pre-characterizer is used and a timing verifier determines the timing characteristics of each of the datapath cell netlists. A netlist compiler compiles these netlists and provides the compiled netlists to the timing verifier. A logic optimizer preferably optimizes the resynthesized netlist according to user constraints.

The method and apparatus of the present invention are advantageous in that a more optimal IC design can be produced. This is because timing characteristics of datapath components (cells) can be obtained by a datapath synthesizer. The datapath synthesizer can replace the datapath cell instances in the netlist that do not provide an optimal timing solution with alternative datapath cell instances after analyzing the timing characteristics of cells in the architecture library. It is therefore possible to design timing-optimized integrated circuits with faster processing performance than was possible with previous synthesis techniques.

These and other advantages of the present invention will become apparent upon reading the following detailed descriptions and studying the various figures of the drawings.

BRIEF DESCRIPTION OF THE DRAWINGS

FIG. 9 is a flow diagram illustrating the step "Synthesize Using Timing and Query Databases" of FIG. 1;

FIG. 11 is a flow diagram illustrating an alternate method of implementing the step "Synthesize Using Timing and Query Databases" of FIG. 1; and FIG. 12 is a block diagram of a system for implementing the method of FIG. 11.

DETAILED DESCRIPTION OF THE PREFERRED EMBODIMENTS

Figure 1:
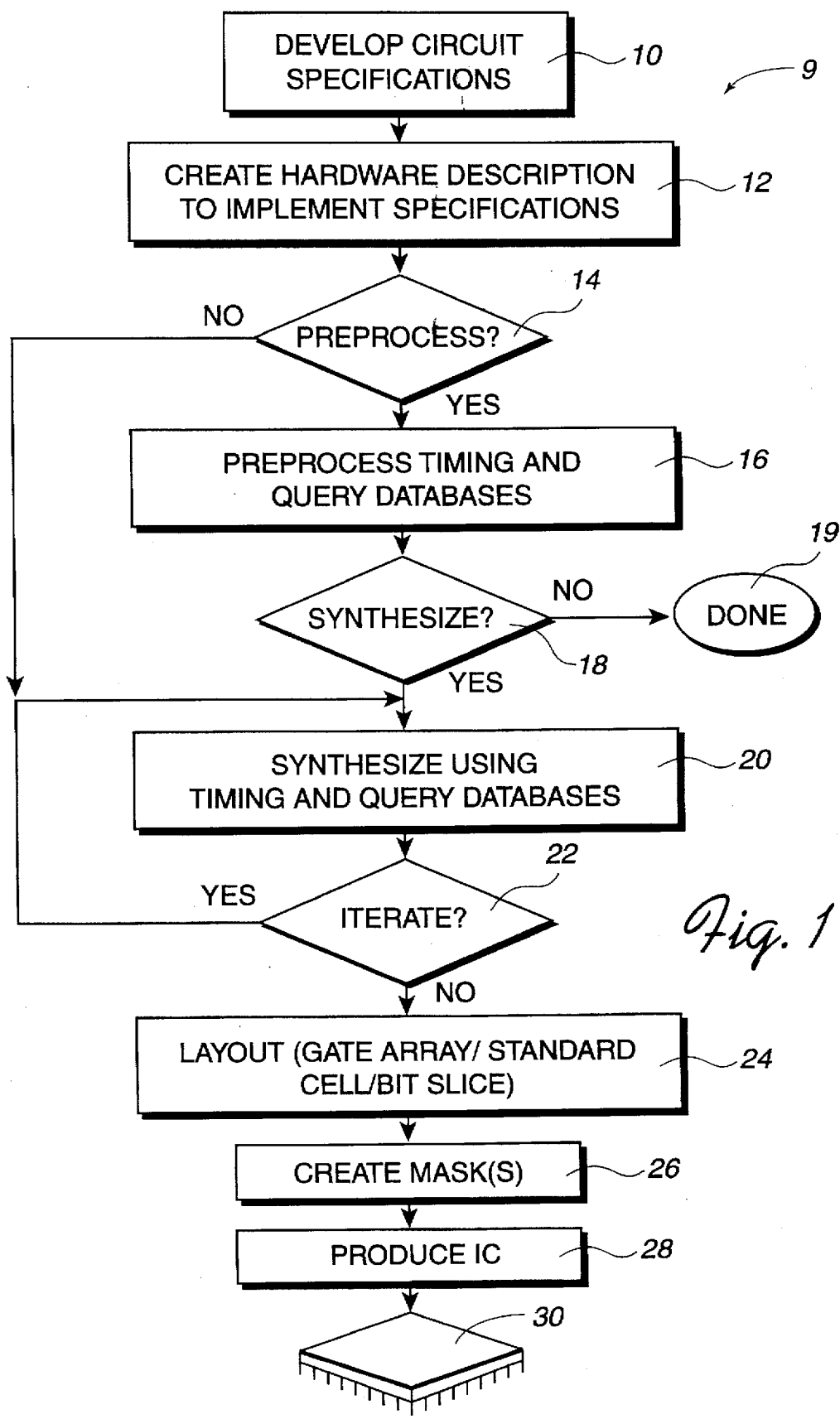
FIG. 1 is a flow diagram illustrating a process for producing an integrated circuit in accordance with the present invention.

FIG. 1 illustrates a method 9 in accordance with the present invention for producing an integrated circuit (IC). The method begins in step 10 with the development of the circuit specifications to implement a desired design. For example, required inputs and outputs are specified, as are speed and other performance parameters. After creating the circuit specifications, the process continues with step 12 and a hardware description of the circuit is written by a circuit designer in a hardware description language (HDL) such as the IEEE Standard VHDL (VHSIC Hardware Description Language), or Verilog®, a standard from Open Verilog International.

Once the circuit is specified, the process determines in step 14 if preprocess steps are appropriate. In some embodiments, preprocess steps are performed to update timing and query databases; the preprocessing can be accomplished before a circuit is synthesized and produced or to simply update the databases. In different embodiments, such as the embodiment described with reference to FIG. 11, the preprocess steps are omitted and the circuit is directly synthesized and produced. If there is no preprocessing, the method continues to step 20, described below. If there is preprocessing, step 16 is implemented, in which timing and query databases are preprocessed. The preprocessing of the timing and query databases are detailed with respect to FIG. 3. After step 16, it is determined if a circuit is to be synthesized. In some cases or embodiments, only the timing and query databases are desired to be processed and updated, as in step 16, and no circuit need be synthesized; the process thus terminates at 19. In some embodiments, the timing data stored in the timing database can be used for other purposes besides synthesizing integrated circuit netlists. For example, the timing data can be used for timing verification for improved computer processing speed. In other embodiments, the timing and query databases can be processed and a circuit can be synthesized and produced directly afterwards. If no synthesis is to occur, the process is complete as indicated at 19.

If circuit synthesis is to occur, step 20 is implemented, in which the circuit is synthesized using the timing and query databases. This step is described in greater detail with respect to FIG. 9. Once the circuit is synthesized, step 22 determines whether the synthesis process should continue in an iterative process to gain more optimal results in view of constraints, such as timing constraints. If so, step 20 is again implemented. If not, step 24 is implemented, in which the netlist is converted into a circuit layout using tools such as place and route tools and silicon compilers. For example, the layout could be a gate array layout, a standard cell based layout, or a bit-slice layout. Once the circuit layout is completed, a mask of the layout is created in step 26. This mask is then used to fabricate the integrated circuit (IC) chip 30 in step 28. Steps 10, 12 and 24–28 are well known to those skilled in the art.

FIG. 2 is a block diagram of a computer system 29 used to implement at least part of process 9. This system includes a digital processor or central processing unit (CPU) 31, a keyboard input device 32, a monitor output device 34, read-only memory (ROM) 36, random-access memory (RAM) 38, mass storage 40, and removable storage 42. As used herein "memory" will refer collectively to any form of memory accessible by the CPU 31, including, but not limited to, ROM 36, RAM 38, mass storage 40, and removable storage 42.

Keyboard 32 is a preferred user input device for entering HDL description 43 for use by the CPU 31, but other devices and input methods are well known to those skilled in the art. Mass storage 40 is typically a hard disk storage unit capable of storing many megabytes of data in a non-volatile fashion. Removable storage device 42 is typically a floppy disk unit used to transfer data to and from computer system 29.

An example of a computer system 29 suitable for use with the present invention is an HP 700 Series workstation, available from Hewlett-Packard, Cupertino, Calif. or a SUN SPARC workstation available from Sun Microsystems, Inc., of Mountain View, Calif. Of course, other computer systems that are capable of supporting integrated circuit synthesis are also suitable.

Figure 2A:
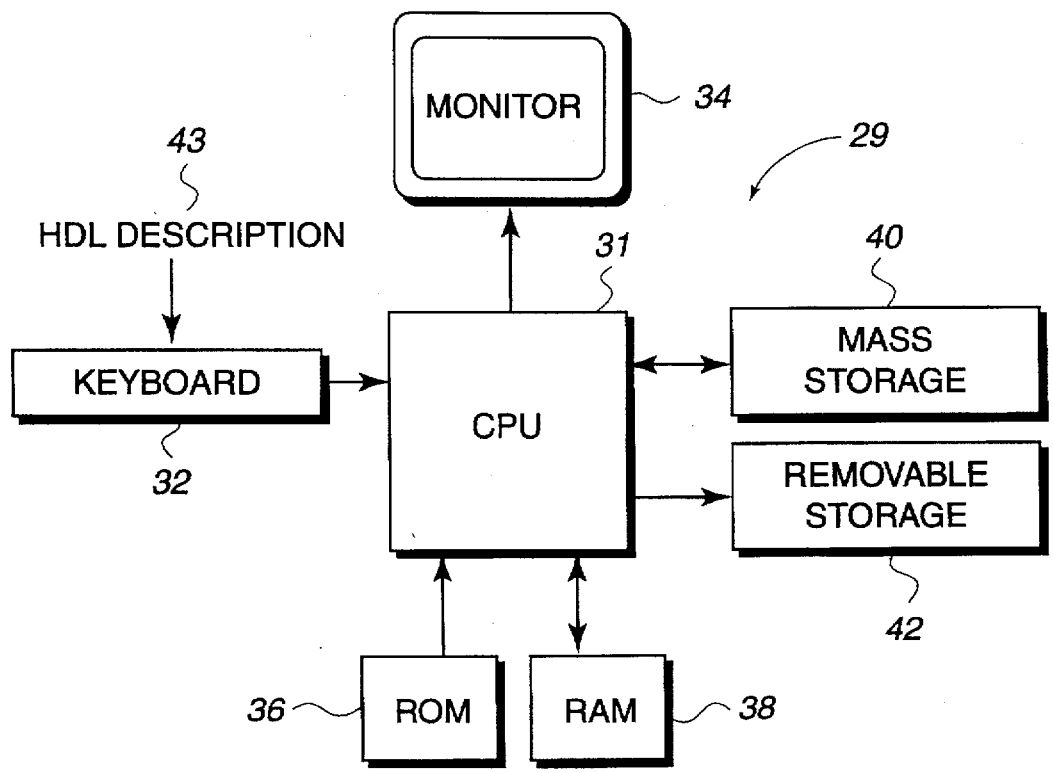
FIG. 2a is a block diagram of a computer system used to implement a portion of the process illustrated in FIG. 1.
Figure 2B:
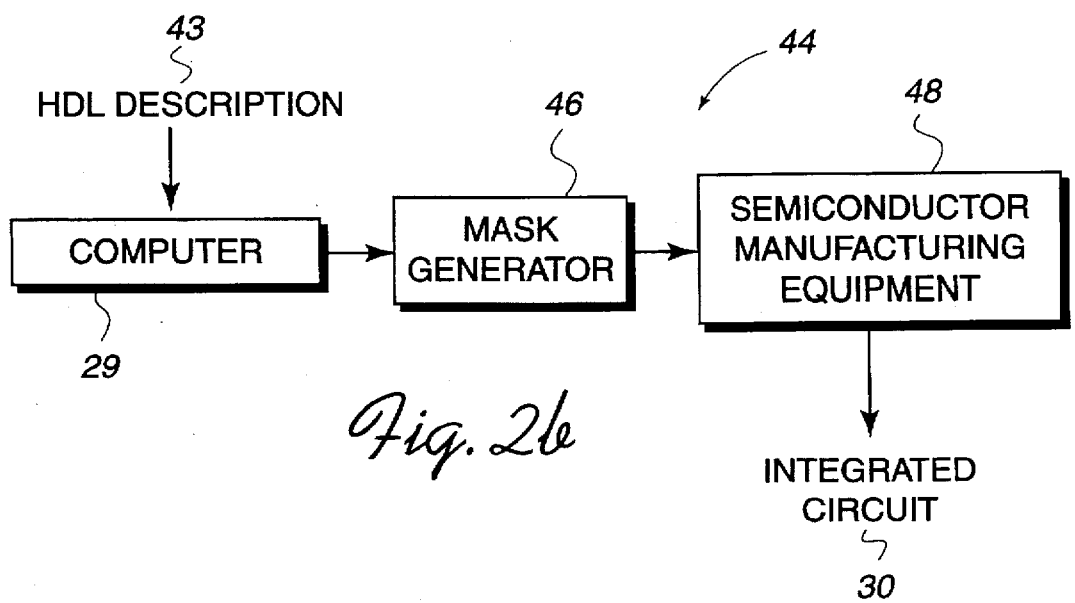
FIG. 2b is a block diagram of a system for producing an integrated circuit in accordance with the process of FIG. 1.

In FIG. 2b, a block diagram of a system 44 for producing an IC 30 in accordance with the present invention is shown. The specification of IC 30 is inputted as HDL description 43 into the computer system 29. A mask generator 46 creates a set of IC masks from mask generation data provided by computer system 29. The mask generator 46 can either be implemented as a part of the computer system 29 or as a separate system. An example of a suitable mask generator in machine form is MEBES® available from Mebes, Inc. This mask generator 46 fabricates masks which are then used with semiconductor manufacturing equipment 48 during the production of the IC 30. Semiconductor manufacturing equipment 48 typically includes such items as stepper lithography units available from Cannon, Inc. and Nikon, Inc. of Japan, among others, which directly utilize the mask sets for photolithography processes.

At this point, some definitions will be useful. "Datapath" refers to a portion of a circuit design that describes operations such as addition, subtraction, and comparison. Datapaths are composed of "datapath cells," such as adders, subtracters, multipliers, multiplexors, arithmetic-logic-units, flip-flops, latches, and register-files. Each datapath cell is a netlist composed of primitive or "leaf-level" cells. The "macro-level" datapath cells and the leaf-level primitive cells are available in datapath libraries, such as 1 micron and 0.8 micron datapath libraries available from VLSI Technology, Inc., of San Jose, Calif., and are well known to those skilled in the art. A datapath library is also referred to as an "architecture library" herein; preferably, the architecture library includes a datapath library and other libraries. Datapath cells are also referred to as "entries", "cell entries," and "datapath components" herein.

Figure 3B:
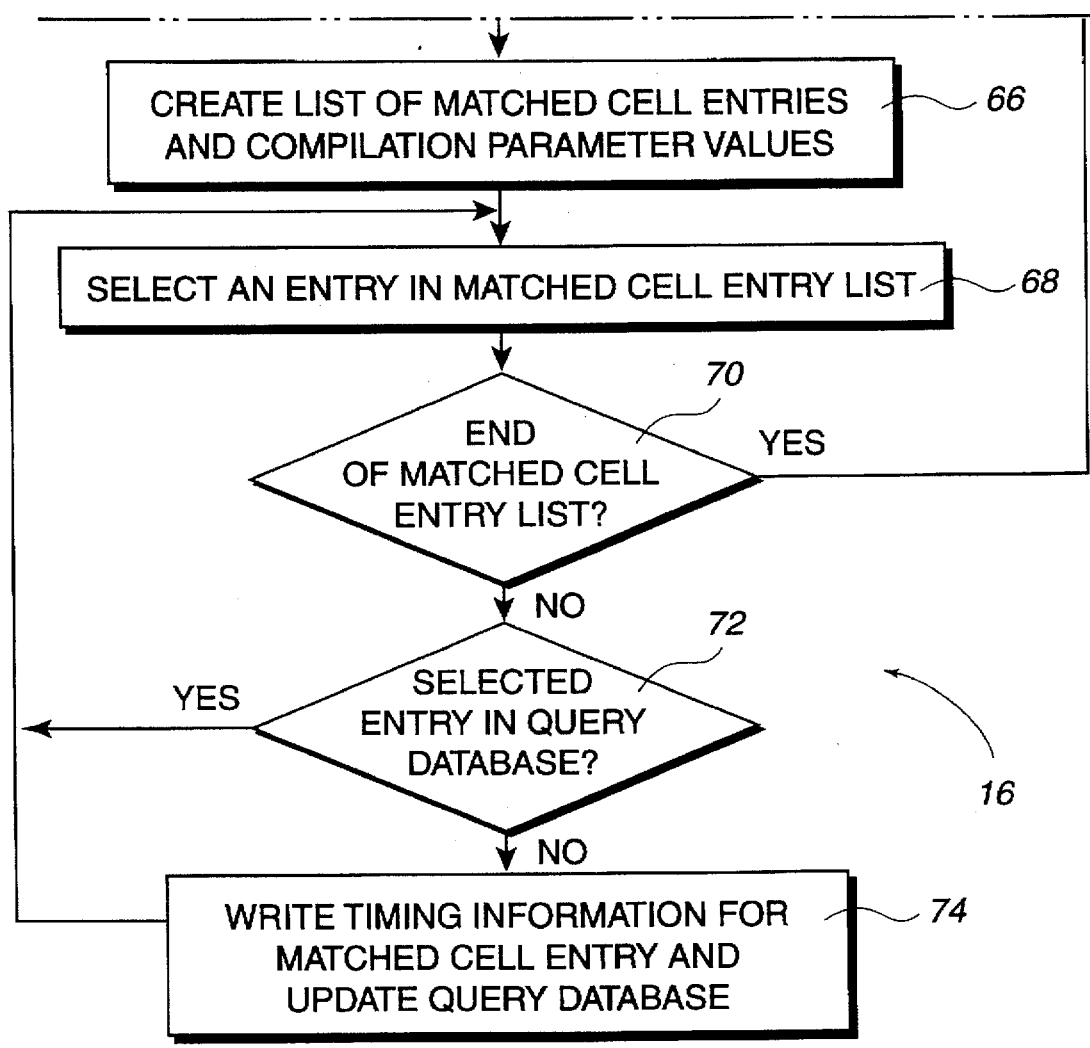
FIG. 3 flow diagram illustrating the "Preprocess Timing and Query Databases" step of FIG. 1.

FIG. 3 is a flow diagram illustrating step 16 of the method of FIG. 1 in greater detail, in which the timing and query databases are preprocessed. The process starts at 50, and, in a step 52, the hardware description language (HDL) description 43 provided by a user to define the circuit specifications of the integrated circuit 30 is parsed to a control data flow graph (CDFG). As it is well know to those skilled in the art, a CDFG is a graph with nodes and directed edges. Nodes represent actions, operations, or assignments, and the edges represent transfer of control from one node to another. Each edge is associated with a condition under which control passes from one node to another. A reference describing CDFGs is found in "On Optimal Extraction of Combinational Logic and Don't Care Sets from Hardware Description Languages", G. Colon-Bonet et al., ICCAD 1989.

Next, in step 54, an expression tree is generated for each output from the CDFG. As is well known to those skilled in the art, an expression tree has a root node, a set of intermediate nodes, leaf nodes and a set of directed edges that point from one node to another. A leaf node represents a primary input or a constant. An intermediate node represents an operation. The associated operation is applied to the nodes to which edges of the intermediate node are pointing.

The methods for generating expression trees from CDFG are well known to those skilled in the art. In general, the expression trees fall into two categories: 1) acyclic expression trees corresponding to combinational logic; and 2) cyclic expression trees corresponding to sequential logic. Acyclic expression trees derive their name from the fact that there are no feed-back loops or "cycles" in the expression tree, as opposed to cyclic expression trees which include such feed-back loops. An acyclic expression tree is a special case of a directed acyclic graph (DAG), which is also used in the literature. The G. Colon-Bonet et al. reference cited above describes expression trees and their derivation from CDFGs.

In step 56, the expression tree is partitioned. By "partitioning", it is meant herein that, based on the architecture library and other criteria specified by the user, the nodes in the expression trees are categorized into datapath types and random logic types. The datapath type includes operations that can be performed by cells in the architecture library. Examples of datapath types are multi-bit operations (such as 16-bit multiplier, adder, subtracter, etc.) and multi-bit storage elements (such as 16-bit flip-flop, counter, etc.). Operations which are of smaller bit widths or operations that cannot be implemented efficiently using datapath cells are partitioned as a random logic type. The random logic type is mapped to logic gates using logic synthesis and optimization techniques which are well known to those skilled in the art. The present invention applies to the datapath logic partition of the expression trees.

In step 56, a list of datapath operators present in the HDL description are generated from the datapath expression trees based on the partitioning method/scheme described above. All datapath operations are identified and grouped into a list of datapath operators. These operators are stored in an order.

In step 58, a datapath operator is selected from the list of datapath operators. This operator is preferably the next operator in the list's order, and is the first operator in the list if this is the first time implementing step 58. In step 60, the current selection from the list is checked. If a "null" or similar non-entry data was selected in step 58, then the end of the list has been reached. When the end of the list is reached, the query and timing databases will have completely preprocessed the datapath operations specified in the HDL description 43, and the process 16 is complete as indicated at 62.

If the end of the list has not been reached, step 64 is implemented, in which the selected operator is matched to entries in the architecture library. These entries are the datapath components or "cells" stored in the architecture (datapath) library. To match the operator to one or more entries, different methods can be used. In the preferred embodiment, a tree pattern matching method is used, as described in patent application Ser. No. 07/877,951, by Mahmood et al., filed May 1, 1992, entitled, "Improved Datapath Synthesis Method and Apparatus Utilizing a Structured Cell Library," abandoned for continuation now U.S. Pat. No. 5,519,627 which is hereby incorporated by reference herein. The operator is one or more nodes in an expression tree which can be matched to entries in the database for the architecture library having a similar tree structure.

In next step 66, a list of matched datapath cell entries and the corresponding compilation parameter values required to implement the selected operator are created. This list includes all the datapath cell entries in the architecture library that can be used to implement the selected operator. For example, there may be several different types of datapath cells in the architecture library that can implement an operator. An adder, adder-subtractor, or ALU can all perform addition. Furthermore, there can be several types of adders, subtractors, ALU's, etc. that can all implement the selected operator. For example, a ripple carry adder, conditional sum adder, and carry select adder are some well known adder architectures. Examples of datapath cells in an architecture library are shown in Table 2, below. In addition, some HDL synthesizer implementations may have built-in architectures which can implement adders, subtracters, adder-subtracters, etc., as described with reference to FIG. 8.

In addition, each matched datapath cell in the list includes information such as the datapath cell name that implements a given HDL operation, the port values for the cell instance, other parameter values, and the datapath library name from which the cell came. As referenced herein, each "selected entry", "selected cell entry", or "matched datapath cell entry" of the process of FIG. 3 is a data structure which includes the above information.

Furthermore, compilation parameter values are included in the list of matched entries. Such compilation parameter values preferably include the width of the input arguments of the operator and other parameters that control various properties, such as the functionality and size of the compiled netlist. For example, a 16 by 8 signed multiplication can be implemented by a signed/unsigned datapath multiplier cell when three compilation parameters dictate that a first data input is 16 bits wide, a second data input is 8 bits wide, and that the multiplication is unsigned (by designating the unsigned parameter as, for example, "false"). In this example, the cell entry's netlist is generated and compiled in accordance with the above values of the three compilation parameters.

In next step 68, an entry is selected from the matched cell entry list created in step 66, such as the next entry in the order of entries stored; this is the "selected entry" or "matched cell entry." In step 70, it is checked if the end of the entry list has been reached, i.e., if a null entry was selected in step 68. If so, then the process returns to step 58 to select another operator and match cell entries in the architecture library to that operator. If the end of the entry list has not been reached, then step 72 is implemented, in which the process checks if the selected cell entry is in the query database. The records in the query database are checked to determine if the selected entry already has a corresponding record stored in the query database.

A preferred query database record is described in greater detail below with respect to FIGS. 4 and 5. Preferably, a number of the field values of each record in the query database is compared with corresponding field values of the selected entry. These compared field values are preferably the datapath cell or architecture name 100, width 102, parameter names and values 103, timing model 104, and environment variable names and values 108. Note that "width" is a parameter common to all datapath cells, and thus has a separate field in record 98. If all the above field values of a record match the corresponding field values of the selected entry, then this matched cell entry has already been examined by the process of FIG. 3 in a previous preprocessing cycle and its timing characteristics have been stored in the timing database. The "name of entry in timing database" field 106 provides information where the timing characteristics for this record are stored in the timing database. The process then returns to step 68 to select the next cell entry in the matched cell entry list.

If, however, at least one of the above-named field values in the record of the selected entry is different from the corresponding field value in the record, then there is no match to the record and another record in the query database is selected to be compared to the selected entry. If no records in the query database match all of these field values, then, in step 74, the selected entry's timing information is calculated and stored in the timing database. Also, the query database is updated by appending a record with the various field values corresponding to the field values of the selected cell entry. Step 74 is described in greater detail with respect to FIG. 4.

After timing information has been stored and the query database updated, the process returns to step 68 to select the next entry in the matched cell entry list and generate timing information similarly to the method described above.

Figures 4, 5:
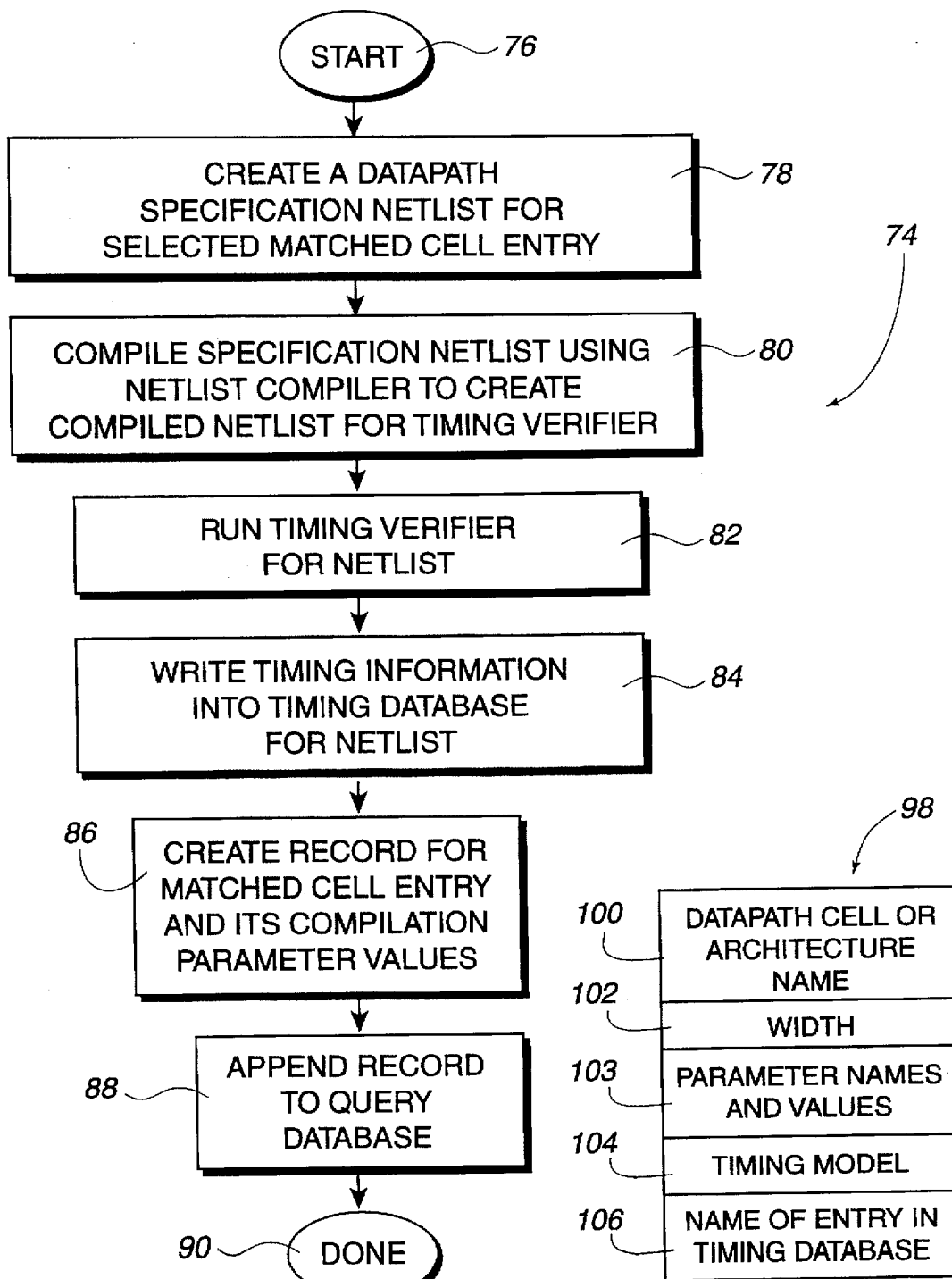
FIG. 4 is a flow diagram illustrating the "Write Timing Information for Matched Cell Entry and Update Query Database" step of FIG. 3.
FIG. 5 is an illustration of a record structure stored in the query database.
Figure 7:
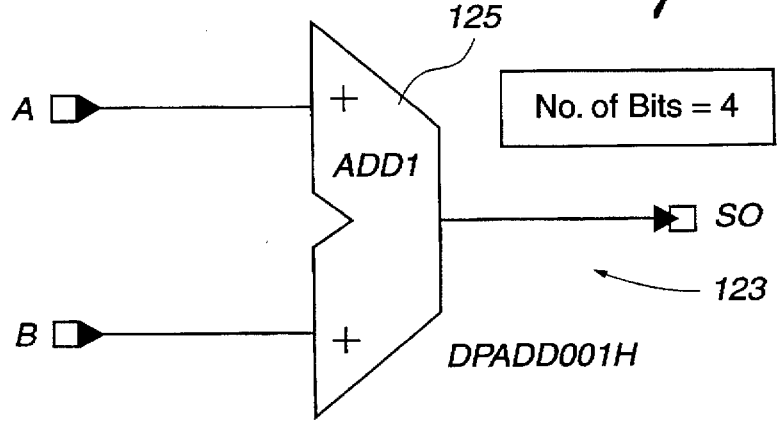
FIG. 7 is a schematic illustration of a datapath specification netlist produced by the datapath characterizer of the present invention.

FIG. 4 is a flow diagram illustrating step 74 of FIG. 3 in greater detail, in which timing information is stored in the timing database and the query database is updated for the selected matched cell entry. The process begins at 76, and, in step 78, a datapath specification netlist is created for the selected cell entry. Netlists are an internal structural representation of a circuit in text form. A schematic netlist is a structural representation of a circuit in graphical form. A datapath schematic netlist is a functional level netlist which is an input to a datapath compilation tool, such as the COMPASS Datapath Compiler from COMPASS Design Automation, Inc., of San Jose, Calif. For example, if the selected entry is a datapath adder cell, such as cell DPADD001H from the VCC4DP4 datapath library (which is available from VLSI Technology, Inc., of San Jose, Calif.), and has a 4-bit width, then a datapath specification netlist is created which instantiates this adder. An example of a datapath specification netlist for an adder is shown in the example of FIG. 7, described below. The 4-bit width of the adder is specified by the parameter "NO OF BITS=4" as shown in FIG. 7.

In step 80, the datapath specification netlist is compiled using a netlist compiler, such as the COMPASS Datapath Compiler mentioned above. The netlist compiler is not limited to but can preferably include two types of compilers: a datapath compiler and an architecture compiler. These compilers are described in greater detail with respect to FIG. 8. Process 74 is described with respect to a datapath compiler. The datapath compiler can map the datapath schematic netlist to various representations, such as a compiled layout model netlist (for bit-sliced layout) a gate-level netlist, as is well known to those skilled in the art. The layout-model netlist and the gate-level netlist are used for timing verification. A gate-level component listing produced by the netlist compiler (datapath compiler in this case) for the 4-bit DPADD001H cell is shown in Table 3, below.

Step 82 is implemented next, in which the timing verifier processes the compiled specification netlist (the "current netlist") of the selected entry. A timing verifier generates the pin-to-pin timing of the circuit described by the compiled netlist. A suitable timing verifier that can also generate a timing database is described in patent application Ser. No. 08/366,701, filed Dec. 30, 1994, by A. Spyrou, entitled, "Method and Apparatus for Determining the Timing Specification of a Digital Circuit" now U.S. Pat. No. 5,555,187, which is hereby incorporated by reference herein.

The timing verifier produces timing characteristics for the current netlist that are written into a timing database, as shown in step 84. The process of writing timing data into a database is described in the abovementioned patent application Ser. No. 08/366,701, which has been incorporated by reference. The timing database stores the timing information organized for each matched cell entry so that a timing verifier can use this pre-computed data during timing analysis of a large netlist which instantiates netlists for several matched cell entries and pass timing inormation in the form of required and arrival times to the synthesis process, as shown in step 20 of FIG. 1. An example of stored timing characteristics is shown in Table 4 with reference to FIG. 6, below.

In next step 86, the query database is updated for the selected cell entry by creating a record for the compiled current netlist with appropriate field values. A preferred record is shown and described with respect to FIG. 5 and includes information about a location in a timing database and other characteristics of the selected cell entry. In step 88, the query database is informed that the timing information for the selected cell entry has been generated and the created record is stored in the query database. The created record is appended to the query database in a location that allows a process that accesses the query database to find the record when searching for a match for a particular cell entry. The process can access the information in the record to determine if the timing for the stored datapath cell entry meets the needs of the accessing process. The process 74 is then complete as indicated at 90.

FIG. 5 is a diagrammatic illustration of a preferred record data structure 98 used to organize data for a selected cell entry in the query database as described with reference to FIG. 4. Record 98 preferably includes a field for a datapath cell or architecture name 100 which is used to reference the entry. The datapath cell or architecture name for each cell in a library is already assigned when a datapath library is first created, such as "DPADD001H" in the example below. There can be many entries in the query database with the same architecture name, but all the entries cannot have identical field values. For example, for 4-bit, 8-bit, and 16-bit configurations of the DPADD001H adder cell, there are three separate records in the query database. All three records have the same architecture name "DPADD001H," but the width field 102 has different values of 4, 8, and 16, respectively, for the 4-bit, 8-bit, and 16-bit configurations.

A width or number of bits which the datapath entry operates with and outputs is stored in field 102. Parameter names and values field 103 is used to store other parameters and their values, such as a "signed" parameter, width-of-Y parameter, etc. The name of a timing model is stored in field 104, which is a standardized model used to compute the timing information for the cell entry. For example, timing information about a circuit can be based on a timing model such as the Prop-Ramp model, Input Slope Model (ISM), or other models well-known to those skilled in the art. The name of the utilized timing model is stored in field 104. The name of a location (such as a filename, address, etc.) in the timing database is stored in field 106, which is the location in the timing database where the timing information for this matched cell entry is stored. Finally, in field 108, preferred environment variable names and the corresponding values that were used when the timing information was generated are stored. Such environment variables include temperature, reference voltages, an indication of fast or slow fabrication process, or other conditions of the circuit's environment, since these values also affect the timing of the compiled netlist.

Figure 6:
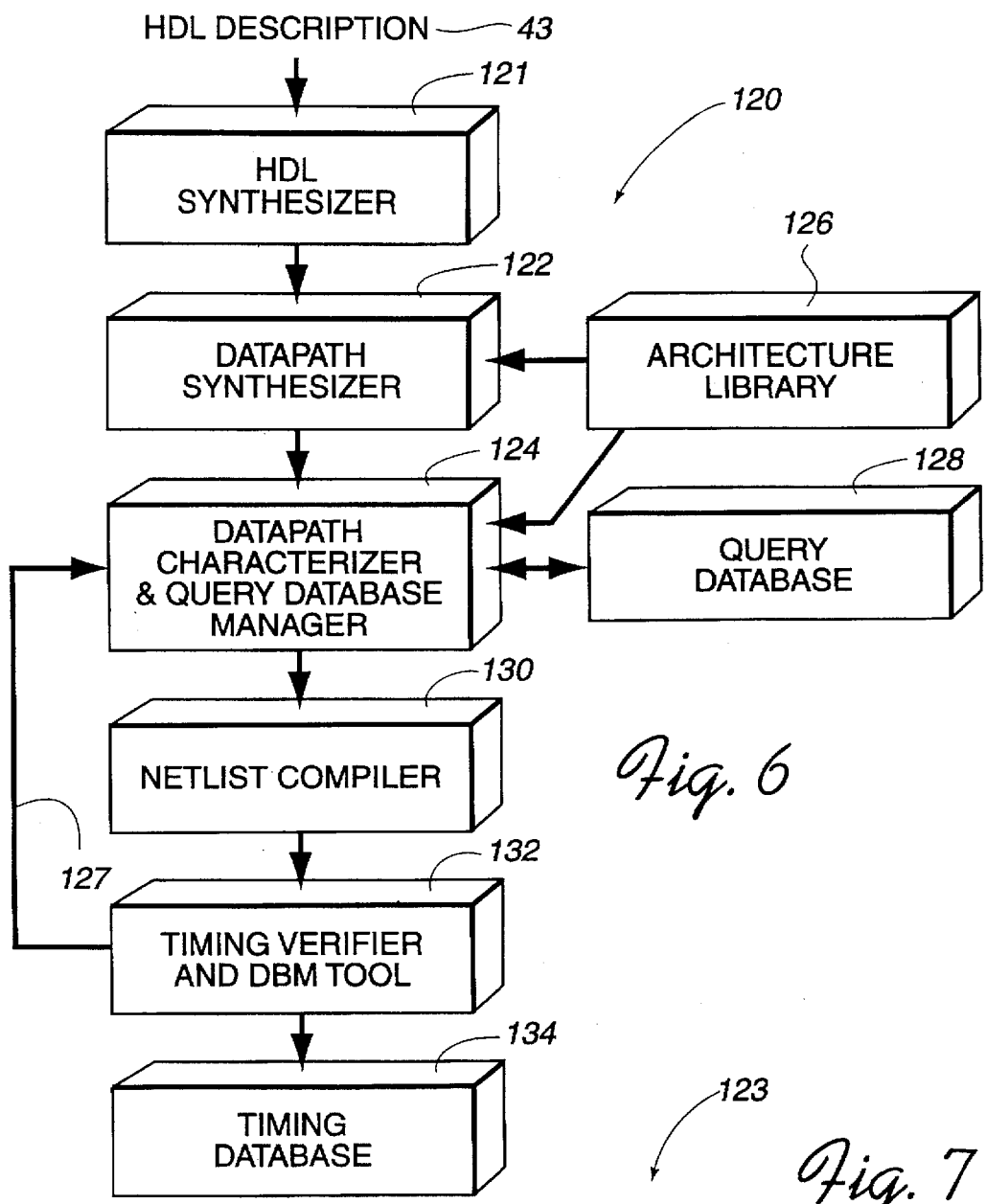
FIG. 6 a block diagram of a pre-characterizer for implementing the method shown in FIG. 3.

FIG. 6 is a block diagram showing a "pre-characterizer" 120 for preprocessing the timing and query databases according to step 16 of FIG. 1 and as detailed with respect to FIG. 3. Pre-characterizer 120 is preferably implemented within the computer system 29 as shown in FIG. 2a. The pre-characterizer includes an HDL synthesizer 121, a datapath synthesizer 122, a datapath characterizer and query database manager 124, an architecture library 126, a query database 128, a netlist compiler 130, a timing verifier and database management tool 132, and a timing database 134.

A hardware description language (HDL) description 43 is provided by the user to define circuit specifications of integrated circuit 30. An example of an HDL description 43 of a simple circuit is shown in Table 1.

TABLE 1

| | |
|---|---|
| 1 | library ieee, COMPASS_LIB; |
| 2 | use ieee.std_logic_1164.all; |
| 3 | use COMPASS_LIB.COMPASS.ALL; |
| 4 | entity datapath_design is |
| | port (A, B, C: IN std_logic_vector(7 downto 0); |
| 6 | D, E : IN std_logic_vector(11 downto 0); |
| 7 | W :OUT std_logic_vector(11 downto 0); |
| 8 | X, Y, Z: OUT std_logic_vector(7 downto 0)); |
| 9 | end datapath_design; |
| 10 | architecture behavior of datapath_design is |
| 11 | begin |
| 12 | W <= D + E; -- 12-bit addition |
| 13 | X <= A + B; -- 8-bit addition |
| 14 | Y <= B + C; -- 8-bit addition |
| 15 | Z <= A - C; -- 8-bit subtraction |
| 16 | end behavior; |

The listing of Table 1 is shown in VHDL, an IEEE standard for hardware description languages. As is well known to those skilled in the art, VHDL is a relatively high-level language which allows circuit specifications to be defined in terms of input, output, and various high-level programming constructs. As is well known to those skilled in the art, the above VHDL description is independent of implementation, and is not related to datapath libraries and gate libraries. The description can be simulated by any commercial VHDL simulator. One such simulator is available from ViewLogic Systems, Inc., of Marlboro, Mass.

In the example of Table 1, three distinct sections of HDL are shown. In the first section, lines 1–3, libraries used by the HDL code are specified. In line 1, the VHDL libraries "ieee" and "COMPASS LIB" are specified to be used. In lines 2 and 3, two VHDL packages from the VHDL libraries are specified to be used. In the second section, lines 4–9, input and output ports of the design entity "datapath_design" are described; these ports are of type std_logic_vector. Input ports "A", "B", "C" (8 bit inputs) and "D" and "E" (12 bit inputs) are defined. Also defined are output ports "W" (12 bit output) and "X", "Y", and "Z" (8 bit outputs). In the last section of the HDL description of Table 1, lines 10–16, an architecture behavior of the entity "datapath_design" is specified. The output port "W" is assigned the value of the sum of input ports "D" and "E", the output port "X" is assigned the value of the sum of input ports "A" and "B", the output port "Y" is assigned the value of the sum of input ports "B" and "C", and the output port "Z" is assigned the value of "A" minus "C".

Referring back to FIG. 6, HDL description 43 is input to the HDL synthesizer 121. The HDL synthesizer performs parsing and creates a data flow graph representation for the datapath synthesizer 122. Datapath synthesizer 122 is a tool that maps datapath operators specified in the HDL description 43 to datapath cells or architectures from architecture library 126 and also performs the timing characterization of datapath cells that can implement the datapath operations.

Note that each datapath operation can be implemented by one or more datapath cells from the architecture library. For each datapath operation, the pre-characterizer 120 characterizes all the candidate datapath cells from the architecture library. In the preferred embodiment, the datapath synthesizer 122 is part of a more generalized HDL synthesizer 121 that receives the HDL description 43 and produces a netlist that implements the behavior specified in the HDL description. As described above with reference to FIG. 3, the HDL description generally includes a control part and a datapath part. The control part is implemented using primitive cells from a gate library applying logic synthesis techniques, as is well known to those skilled in the art. The datapath part is implemented using cells from an architecture library. The datapath part can be compiled by a datapath compiler or an architecture compiler.

Only a datapath part is included in the HDL specification of Table 1, described between lines 12–15. In the described embodiment, a generic format of timing characterization of datapath cells is shown in Table 4 with reference to FIG. 6, below.

Datapath synthesizer 122 recognizes the datapath operations in the HDL description 43, and for each datapath operation finds a list of datapath cells from the architecture library 126 that can implement the operator. A parser parses the HDL description into an internal representation, such as control data flow graphs (CDFGs), again by techniques well known to those skilled in the art, which are then converted into expression trees for each output from the CDFGs, as described with reference to steps 52 and 54 of FIG. 3. A list of records corresponding to the datapath operations specified in HDL description 43 is provided by datapath synthesizer 122 to the datapath characterizer 124. Each record includes a pointer to an expression tree, where the root of the tree is a datapath operator; the created list of matched cell entries that can implement that operator (as described in step 66 of FIG. 3). Each matched cell entry has various associated data, such as the signal values for all the ports and the parameter values needed to implement the operation.

For example, for the listing of Table 1, a list of four records corresponding to the three addition operations and one subtraction operation are provided to the datapath characterizer 124. For the 0.8 CMOS VCC4DP4 datapath library from VLSI Technology, Inc., both the addition operation and the subtraction operation can each be performed by six datapath cells. Thus, each record includes a matched cell entry list that has six datapath cells.

For example, in Table 2, some datapath cell entries as stored in the architecture library are shown. These cells are included in the VCC4DP4 library, which is more fully described in VLSI Technology, Inc. 0.8 Micron Datapath Library Manual.

TABLE 2

| Cell Name | Type of Datapath Cell |
| --- | --- |
| DPADD001H | High-Density Adder |
| DPADD001S | High-Speed Adder |
| DPASB001H | High-Density Adder/Subtracter (ASB) |
| DPASB001S | High-Speed Adder/Subtracter (ASB) |
| DPSUB001H | High-Density Subtracter |
| DPSUB001S | High-Speed Subtracter |
| DPALU001H | High-Density Arithmetic Logic Unit (ALU) |
| DPALU001S | High-Speed Arithmetic Logic Unit (ALU) |

Each datapath cell listed in Table 2 can be used for one or more operations listed in lines 10–16 of the HDL description of Table 1 (i.e., addition or subtraction). Also, each of the above cells can be compiled for 8-bit or 12-bit operations based on the width 102 value of FIG. 5, and preferably both the 8-bit and 12-bit cells are matched to the operators of the HDL description of Table 1. The datapath synthesizer 122 selects one of the operations from the HDL description 43 and matches a list of cells, such as from Table 2, to the operation, where each matched cell can implement the selected operation. During this process, the datapath synthesizer 122 also generates the port values and parameter values for each datapath cell needed to implement the operation. As referenced herein, the "selected entry", "selected cell entry" or "matched cell entry" of the process of FIG. 3 is a data structure which includes information such as the datapath cell name that implements a given HDL operation, the port values, the parameter values, and the datapath library name.

For example, with respect to FIG. 2, an addition operation would be matched to adders DPADD001H and DPADD001S; ALUs DPALU001H and DPALU001S; and Adder-Subtractors DPASB001H and DPASB001S, all of which can implement an addition operation. Each architecture is compiled for 8-bit and 12-bit configurations. The matching process is described above with reference to step 64 of FIG. 3. In addition, other cells can be matched. For example, the HDL synthesizer 121 implementing the datapath synthesizer 122 can include built-in and user-defined architectures for implementing adders, subtractors, adder-subtractors, etc.

The datapath characterizer and query database manager 124 receives the list of datapath operators from datapath synthesizer 122. The datapath characterizer 124 selects one of the datapath operators in the list, and then selects one of the matched cell entries in the matched cell entry list for that datapath operation, as described above with reference to FIG. 3; this is the "selected entry." For example, an 8-bit or 12-bit version of the High-Density Adder DPADD001H is selected.

As described above with reference to step 72 of FIG. 3, the datapath characterizer 124 first checks if a selected entry (matched cell entry) with its compilation parameter values and other field values already has a corresponding record in the query database 128. If so, then the timing of that entry has already been characterized and stored in the timing database 134. If the selected entry is not in the query database, then the datapath characterizer creates a datapath specification netlist for the matched cell entry, as described with reference to FIGS. 3 and 4. An example of a datapath specification netlist 123 is shown in FIG. 7. This netlist specifies a datapath cell DPADD001H, a high-density ripple-carry adder cell as specified above, and the label "No. of Bits=4" specifies that the datapath cell is 4 bits wide. Other 8-bit, 12-bit, etc. adders can also be implemented by changing the value of the number of bits parameter. In FIG. 7, 4-bit values at input ports A and B are added together by adder cell 125, which represents the cell used to add the values at ports A and B. The output port "SO" receives the summed value A+B. For example, in line 12 of the HDL description of Table 1, "W <=D+E", for a 12-bit Wide DPADD001H cell, where the no. of bits=12, the D and E signals are connected to the input ports A and B, and the result W is obtained at the output port SO.

Referring back to FIG. 6, the datapath characterizer 124 also sets the values of other cell parameter values, if any, such as a signed or unsigned flag, and which are specified in the datapath specification netlist and used by the netlist compiler. The characterizer 124 sends the netlist to be compiled by netlist compiler 130, as described above in step 80 of FIG. 4. Netlist compiler 130 can be implemented in different ways. In the described embodiment, the netlist compiler is a datapath compiler that receives the datapath specification netlist and generates a compiled implementation of the datapath, either as a bit-sliced layout model netlist or a gate-level netlist. In addition, an architecture compiler can be used to compile netlists from a built-in architecture. These compilers are shown and described in greater detail with respect to FIG. 8.

An example of a netlist compiled by netlist compiler 130 is shown in Table 3. The datapath specification netlist of FIG. 7 (4-bit DPADD001H cell) has been compiled into a gate-level netlist.

TABLE 3

| Cell Name | Insts | Per Cell | Gate Count | Per Cell | Width |
|---|---|---|---|---|---|
| ad01d1 | 4 | 7.5 | 30.0 | 48.0 | 192.0 |
| ni01d2 | 2 | 1.5 | 3.0 | 12.8 | 25.6 |
| Totals: | 6 | | 33.0 | | 217.6 |

The gate-level netlist includes four 1-bit adder cells of drive 1X (ad01d1) and two non-inverting buffers of drive 2X (ni01d2). The total gate equivalent is 33.0 and the total width of the standard cell row is 217.6 units, the use of which is well-known to those skilled in the art.

The compiled netlist of the selected entry is provided by netlist compiler 130 to the timing verifier and database management tool 132. As described above with reference to steps 82 and 84 of FIG. 4, the timing verifier 132 generates the pin-to-pin timing of the circuit described by the compiled netlist. This timing data is written into timing database 134 so that the data is accessible to a process, such as a timing verification process for a large netlist, that makes use of the pre-calculated timing information of "macro-level" datapath cells.

Table 4, presented below, provides a generic example of timing data that has been organized in timing database 134.

Table 4 shows timing characteristics stored for one compiled datapath netlist (i.e., one datapath cell). Note that this is one format among many possible formats in which to store timing characteristics in the timing database.

TABLE 4

Pins:
defines the input and output ports/pins of a datapath cell
A[0] input
A[1] input
A[2] input
A[3] input
B[0] input
B[1] input
B[2] input
B[3] input
SO[0] output
SO[1] output
SO[2] output
SO[3] output
TD Params:
defines some parameter names and values
WidthofRow  217.6
Gate_Count  33
Transistors  132
Timing:
Example of Format for Timing Data:
   Frompin                         ToPin
   MaxRiseProp  MaxRiseRamp   MaxFallProp  MaxFallRamp
   MinRiseProp  MinRiseRamp   MinFallProp  MinFallRamp
   where prefixes stand for:
   Max: maximum                Min: minimum
   Rise: for rising edge         Fall: for falling edge
   Prop: propagation delay     Ramp: ramp factor
   Capacitances:
   A[0]  0.110
   B[0]  0.109
   SO[0]  0.080

As shown in Table 4, the definitions for inputs, outputs, and parameters of the selected datapath cell are provided, followed by actual timing information for pins in the datapath cell. The timing data for the preferred embodiment is partitioned into four parts: Pins, TD Params, Timing, and Capacitances. The "Pins" section defines the pin names for the selected datapath cell and whether the pin is an input, output, or bi-directional pin or port. For example, A[0], A[1], A[2] and A[3] are four input pins and represent the 4-bit wide bus "A" of FIG. 7. The "TD Params" section defines some parameter names and values for the compiled netlist. For example, for the 4-bit DPADD001H adder compiled netlist, the WidthofRow value indicates that the width of the standard cell row is 217.6 units (such as micron units). The "Capacitances" section specifies the capacitances of the input, output, and bi-directional pins of the compiled netlist. For example, in Table 4, the capacitance for pin "A[0]" is specified as "0.110" unit (picofarads(pf) in the described embodiment).

The "Timing" section provides various timing information related to the compiled netlist, such as pin-to-pin timing and set-up and hold timing. This timing preferably includes, for each pin-to-pin path, the maximum and minimum times for the rising edge propagation delay, the rising edge ramp factor, the falling edge propagation delay, and the failing edge ramp factor. For example, one pin-to-pin path entry can be specified as shown in Table 4A, described below.

TABLE 4A

| PP B[1] SO[2] | 2.64 | 1.75 | 2.38 | 1.82 | # Maximum Timing Values |
|---|---|---|---|---|---|
| | 2.41 | 1.75 | 2.15 | 1.82 | # Minimum Timing Values |

The term "PP" denotes "pin-to-pin" timing data. The timing data is specified from input pin B[1] to output pin SO[2]. The first four numbers are maximum timing values for rising edge propagation delay (2.64 nanoseconds(ns)), rising edge ramp factor (1.75 ns/pf), falling edge propagation delay (2.38 ns), and falling edge ramp factor (1.82 ns/pf). The last four numbers are minimum timing values for rising edge propagation delay (2.41 ns), rising edge ramp factor (1.75 ns/pf), falling edge propagation delay (2.15 ns), and falling edge ramp factor (1.82 ns/pf).

Herein, the term "timing characteristics" refers to the timing information for a datapath cell, such as the propagation delays and ramp factors listed above.

The timing verifier 132 informs the datapath characterizer 124 on bus 127 that the timing information has been written and the location of the timing information in the timing database 134. The query database manager 124 stores a record, such as the record 98 shown in FIG. 5, in the query database 128. Thus, if a cell record that matches a later-examined matched cell entry is found in query database 128, it is known that the timing characteristics of that cell have already been stored in the timing database.

Figure 8:
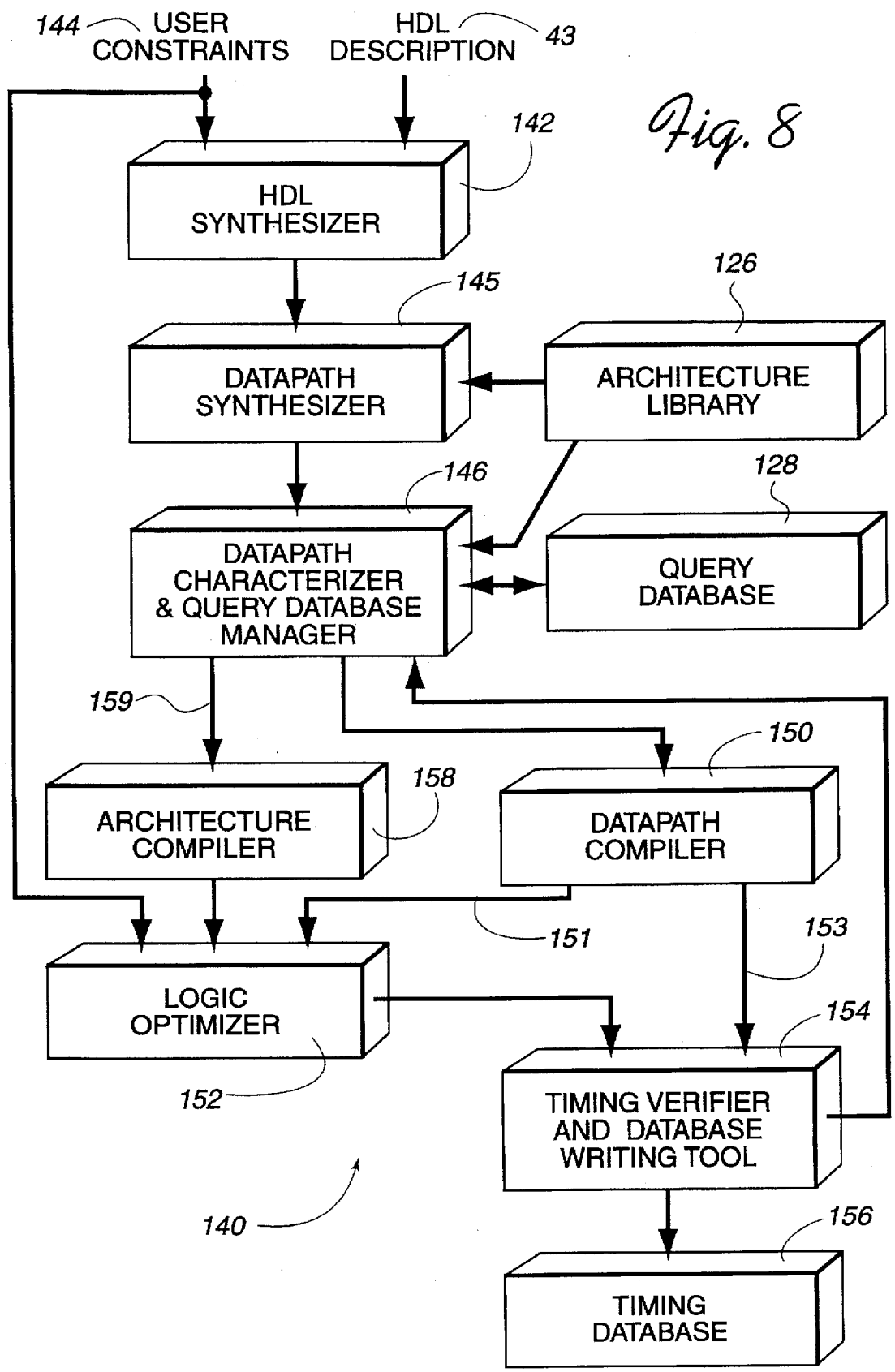
FIG. 8 is a block diagram of an alternate embodiment of the pre-characterizer of FIG. 6.

FIG. 8 is a block diagram of alternate embodiment 140 of pre-characterizer 120 shown in FIG. 6. Pre-characterizer 140 is quite similar to pre-characterizer 120. An HDL description 43 is input by a user into an HDL synthesizer 142, which includes the datapath synthesizer 122 shown in FIG. 6. Also input to HDL synthesizer 142 are user constraints 144, which are any characteristics or criteria the user wishes to impose on the processing of the timing and query databases. For example, the user constraints can include the indication to pre-characterize the current circuit. Also, optimization criteria can be specified. Such optimization criteria are well known to those skilled in the art. For example, the user can constrain the timing of the circuit so that only circuit delays under a stated threshold are stored in the timing database. The optimization criteria portion of the user constraints 144 is provided to the logic optimizer, as described below.

The datapath synthesizer 145 within HDL synthesizer 142 provides a list of records corresponding to the datapath operations specified in the HDL description 43, similarly as described above with reference to FIG. 6. As described above, each record includes a pointer to an expression tree, a list of matched cell entries that can implement that operator. Each matched cell entry has various associated data, such as the signal values for all the ports and the parameter values needed to implement the operation.

The list of operator records is received by datapath characterizer and query database manager 146, which is substantially similar to the datapath characterizer 124 described with reference to FIG. 6. Characterizer 146 accesses query database 128 to determine if each matched cell entry in the list has already been processed and its timing characteristics stored. In one method, as described above, characterizer 146 creates a datapath specification netlist and sends this netlist to datapath compiler 150, which is substantially similar to netlist compiler 130 of FIG. 8. Datapath compiler 150 provides either a compiled layout-model netlist (for bit-sliced layout) or a compiled gate-level netlist. If the netlist is a gate-level netlist, the netlist is output on bus 151 to logic optimizer 152, which optimizes the netlist to provide a more efficient timing and area for the circuit, as is well-known to those skilled in the art. User constraints on the timing and area of the circuit are input to the logic optimizer and can affect the netlist output from the logic optimizer. The logic optimizer 152 provides the optimized netlist to the timing verifier and database writing tool 154. If the output of datapath compiler 150 is a layout-model netlist, then the netlist is output on bus 153 directly to timing verifier 154, as described above with respect to FIG. 6.

Timing verifier database tool 154 creates the timing information for the selected cell entry and stores the timing information in the timing database 156. The timing database tool 154 then provides the location of the stored timing data to the query database manager 146, which writes a timing record in the query database 128. The pre-characterizer then similarly stores timing information for the remaining netlists corresponding to matched cell entries.

In this alternative embodiment, datapath characterizer 146 can also use built-in architectures of the HDL synthesizer 142 and user-specified architectures to implement operations specified in the HDL description 43. In this embodiment, architecture library 126 includes a datapath library, a built-in architecture library, and user-specified architecture libraries. The netlists for matched cell entries from the built-in architecture library and the user-specified libraries are compiled using the architecture compiler 158. For example, the HDL synthesizer 142, can offer a predefined or built-in library of architectures, such as adders, subtracters, adder-subtracters, multipliers and barrel-shifters. Preferably, user constraints 144 can specify datapath library cells from a specific architecture library partition (datapath library, built-in architecture library, and user-specified architecture libraries). If the user constraints specify to use built-in architectures, then datapath characterizer 146 provides the record for each matched cell entry to the architecture compiler 158 on bus 159. The architecture compiler compiles a gate-level netlist corresponding to the matched cell entry. The gate-level netlist is then optimized by logic optimizer 152 and provided to timing verifier and database writing tool 154 as described above. Note that when datapath compiler 150 is used as a netlist compiler, a datapath specification netlist corresponding to a matched cell entry is created by the datapath characterizer 146. This is an extra netlist generation step that is not necessary when using architecture compiler 158.

FIG. 9 is a flow diagram detailing step 20 of FIG. 1, in which a HDL description is synthesized into a final netlist using the timing and query databases in the process of making an integrated circuit. The process begins at 160, and, in step 162, a netlist is synthesized normally, i.e., without using the timing information stored in the timing and query databases. Such a netlist would describe a circuit without optimizing for different types of datapath cells within the circuit. Such synthesis is well known to those skilled in the art. For example, the paper "A Datapath Synthesizer for High-Performance ASICs", M. Mahmood et al., Proc. 1992 Custom Integrated Circuits Conference, pp. 5.1.1–5.1.4, describes a suitable datapath synthesis method.

In next step 164, stored timing characteristics from the timing database are retrieved for alternative matched cell entries for a subset of the datapath cell instances in the netlist produced by step 162. A "datapath cell instance" is a particular compiled netlist for that datapath cell instantiated in a top-level netlist for the IC design. Preferably, the subset of datapath cell instances is determined based on criteria such as user-specified criteria. For example, only datapath cell instances which do not satisfy user-specified timing constraints can be included in this subset. This subset is also referred to as a "datapath netlist subset."

Each datapath cell instance from this datapath netlist subset preferably has a corresponding list of alternative datapath cells. The list of alternative datapath cells was created during step 162 in the normal synthesis operation, and is similar to the matched cell entry list (created in step 66 of FIG. 3) except that the alternative list does not include the current datapath cell from the subset. Thus, an alternative matched cell instance is a datapath cell instance that implements the same operation as the cell instance from the subset, but is a different datapath cell instance. For example, with reference to Table 2, if a datapath cell instance is an instance of the 4-bit DPADD001H adder cell, then an alternative cell instance can be a different adder instance, such as an instance of 4-bit DPADD001S, or an ALU instance, such as an instance of 4-bit DPALU001H. For each matched cell entry in the list of alternative datapath cells, an alternative datapath cell instance can be created by compiling a netlist using the information stored in the matched cell entry. Such alternative cell instances are created for optimization purposes. During optimization, the original datapath cell instance from this datapath netlist subset can be replaced by an alternative datapath cell instance generated as above to improve the timing performance of the synthesized design.

The timing information for an alternative matched cell entry in the list is found by matching the alternative cell entry with the records stored in the query database. The timing characteristics for the matched cell entry were usually created in previous step 74 of FIG. 3. Preferably, the field values of the alternate datapath cell entry must match all the corresponding fields of a record in the query database for a match to exist. Thus, a record 98 is found which matches the necessary field values for datapath cell name 100, width 102, parameter names and values 103, timing model 104, and environment variable names and values 108. Once a record in the query database is matched to the alternate datapath cell instance, the value for "name of entry in timing database" field 106 of the matched record is used to retrieve the timing information from the timing database 156. Such timing information, for example, can be organized as shown in Table 4. This timing information is then used to evaluate the suitability of the alternate datapath cell instance, as described below. Alternatively, if no timing information is available in the timing database for the alternative instance, then the timing information can be generated and stored using process 74 as shown in FIG. 4.

Timing information for all of the alternative datapath cells that implement the functionality of a datapath cell instance in the netlist is similarly retrieved.

In step 166, the netlist is resynthesized using the retrieved timing characteristics of alternative datapath cells to optimize the final netlist. After retrieving the timing characteristics of each alternative datapath cell, the resynthesizer measures the delays in the synthesized circuit for each alternative cell. The resynthesizer then selects an alternative datapath cell that improves the timing performance of the netlist, and uses an instance of the selected alternative cell in the netlist instead of the original datapath cell instance. In some cases, the original datapath cell instance is the best alternative. This resynthesis step is iterated until further timing improvement is not feasible. This iteration for resynthesizing an optimal netlist is shown as step 22 of FIG. 1, described above. The process is then complete as indicated at 168.

Figure 10:
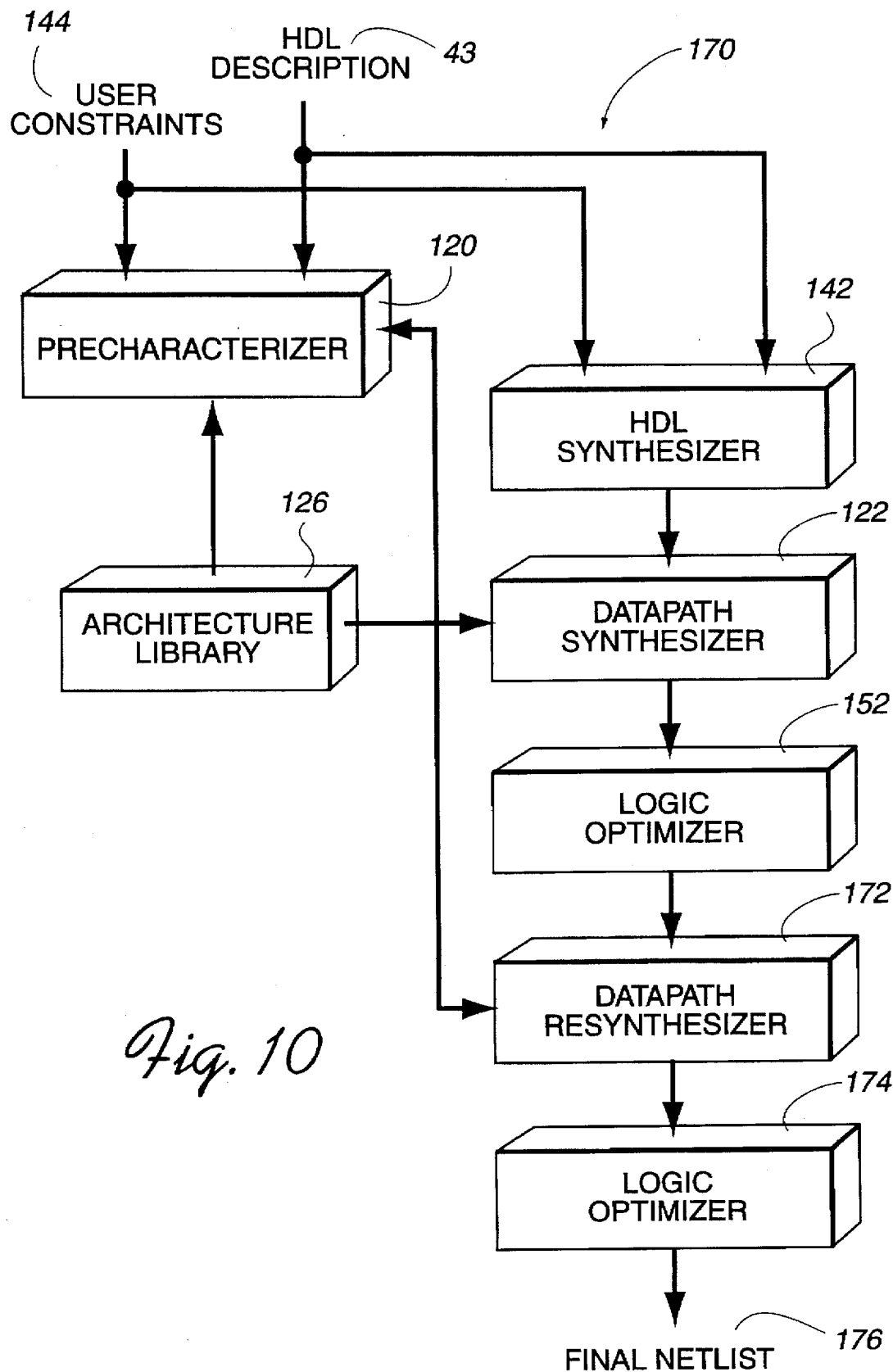
FIG. 10 is a block diagram of a system for implementing the method of FIG. 9.

FIG. 10 is a block diagram of a system 170 for processing query and timing databases and synthesizing a final netlist for a circuit according to the method of FIG. 9. The HDL description 43 and user constraints 144 are input to the pre-characterizer 120. The pre-characterizer 120 is similar to the datapath characterizer and query database manager 124 or 146, as shown in FIGS. 6 and 8. The pre-characterizer analyzes the HDL description 43 and updates query and timing databases within pre-characterizer block 120. Architecture library 126 contributes datapath library cells to the pre-characterizer 120 and datapath synthesizer 122. One advantage to this embodiment is that if the same HDL description 43 is input to the HDL synthesizer 142, the timing characteristics for matched cell entries are obtained by accessing the data from the query and timing databases stored by the pre-characterizer 120.

After the storage of datapath operators in HDL description 43 by pre-characterizer 120, the HDL description 43 and user constraints 144 are input to HDL synthesizer 142 for synthesis of a final netlist. HDL synthesizer 142 is preferably the same synthesizer that is used in pre-characterizer 120. The HDL synthesizer 142 partitions an internal representation of the HDL description into datapath and random logic parts, and passes the partitions to datapath synthesizer 122, which is typically a component of the HDL synthesizer 142.

The datapath synthesizer 122 then implements several datapath netlists using datapath cells from the architecture library 126. The architecture library can include one or more libraries, such as a bit-sliced datapath library, a built-in architecture library, or several user-defined architecture libraries. The HDL synthesizer 142 then produces a top-level netlist which implements the remaining random logic part and instantiates these datapath netlists. The top-level netlist produced by the HDL synthesizer 142 and the datapath netlists produced by the datapath synthesizer 122 are provided to the logic optimizer 152, which optimizes the random logic part of the netlist using well-known gate-level logic optimization methods, i.e., without using alternative datapath cells for optimizing the timing of the circuit. The logic optimizer 152 uses the optimization criteria input as user constraints 144; for example, particular circuit delay characteristics, circuit area, circuit speed, and circuit power can be specified. Since there are likely multiple implementations of the desired integrated circuit, a gate-level implementation is chosen by optimizer 152 which provides the best compromise to a given set of optimization criteria. Often, the optimization criteria place a high emphasis on minimum circuit area (i.e. the most compact circuit implementation) that satisfies given timing requirements. For example, "DAGON: Technology Binding and Local Optimization by DAG Matching", K. Keutzer, 24th DAC, 1987, pp 341–347 is useful background art in understanding this process.

Logic optimizer 152 provides an optimized netlist to datapath resynthesizer 172, which is coupled to pre-characterizer 120 by bus 178. Resynthesizer 172 calls the pre-characterizer and accesses the query database to find the records that match the matched datapath cell entries instantiated in the optimized netlist produced by logic optimizer 152. The datapath resynthesizer 172 then accesses the query and timing databases for alternative datapath cells through the pre-characterizer 120. Using the timing characteristics of the alternative datapath cells, the datapath resynthesizer 172 resynthesizes the datapath netlist based on the user constraints 144 to improve the timing performance of the datapath netlist. Logic optimizer 174, which is similar to logic optimizer 152, then further optimizes the gate-level part of the netlist according to user constraints to produce a final optimized netlist 176.

FIG. 11 is a flow diagram illustrating an alternate method 20' for step 20 of FIG. 1 for dynamically characterizing datapath cells when synthesizing a netlist instead of pre-characterizing the timing information in a timing databases. In this alternative embodiment, the preprocess step 16 of FIG. 1 was preferably not implemented.

The process begins at 180, and, in step 182, a netlist is synthesized normally without timing information of the datapath operators of the circuit, as described above with reference to step 162 of FIG. 9. In next step 184, the timing slacks for the datapath cell instances in the netlist with respect to the user constraints 144 are calculated by using timing verification methods which are well known to those skilled in the art. "Timing slacks" for a net refer to the difference between the "required time" and the "arrival time" for a net. The "required time" and "arrival time" for all nets in a netlist are computed by a timing verifier which propagates the user-specified timing constraints throught the netlist. The timing characteristics of the datapath cell instances in the netlist, stored in the timing database, are used by the timing verifier to propagate the constraints.

In next step 186, if the user-specified timing constraints are not satisfied, then a list of datapath cell instances in the netlist are identified which do not satisfy these timing constraints. Typically, this list of datapath cell instances is often significantly smaller that the total number of datapath cell instances in the netlist. For each datapath cell instance, there is a list of matched alternative datapath cells that was generated in the synthesis step 182 as is well known to those skilled in the art. The resynthesis step 186 preferably considers only a few of the alternative matched datapath cells for improving the timing performance of the datapath netlist. Thus, the timing characteristics for only a few of the alterative matched datapath cells are computed similarly to the process steps 56–60 and 66–74 of FIG. 3. The number of datapath operators processed in step 186 is typically smaller than the number of datapath operators processed in steps 56–60 of FIG. 3, and the number of datapath cells for each datapath operator processed in step 186 is typically smaller than the number of datapath cells for each datapath operator in steps 66–74 of FIG. 3. Therefore, using the same HDL description 43, the number of timing characterizations performed in step 186 is significantly fewer than the number of timing characterizations performed in steps 66–74 of FIG. 3, thereby saving significant processing time for timing characterization.

In addition, the timing information for datapath cells is calculated using a timing verifier and stored locally (such as in RAM) instead of in a timing database. The synthesized netlist is resynthesized using the timing characteristics (stored locally) provided by the timing verifier. The netlist is thus optimized similarly to step 166 of FIG. 9.

The process of FIG. 11 is dynamic and thus differs from the process shown with reference to FIG. 9, in which a preprocessed timing database is accessed. In FIG. 11, the timing characteristic of an alternative matched datapath cell for a current datapath cell with a timing problem is only calculated on demand and provided on the fly. The calculation is only provided for those datapath cell instances that do not meet the user timing constraints. The method of FIG. 9, in contrast, will exhaustively calculate timing characteristics for all datapath cell instances in the netlist, regardless of which cell instances meet timing constraints. Thus, the method of FIG. 9 requires significantly more characterization time than the method of FIG. 11. An additional advantage of the method of FIG. 11 is that there is no need to store and manage a database of timing information, which can be desirable if available storage space is small. The process of FIG. 11 locally stores a comparatively small amount of datapath cells and pointers to corresponding timing information. A disadvantage to this embodiment is that timing characteristics for an operator are recalculated every time the operator is found in a circuit, regardless of whether the timing characteristics for that operator have been previously calculated. A duplication of calculation can thus result, slowing down the process. For example, if HDL description 43 is input to the HDL synthesizer 142 a second time, the timing characteristics for the matched datapath cell entries are recalculated instead of being accessed from the query and timing databases.

FIG. 12 is a block diagram of a system 190 for processing the timing characteristics of alternative datapath cells and synthesizing a final netlist for a circuit according to the method of FIG. 11. The HDL description 43 and user constraints 144 are input to an HDL synthesizer 142, which is similar to the HDL synthesizer described above with reference to FIG. 10. The HDL synthesizer 142 partitions an internal representation of the HDL description to datapath and random logic parts and passes the partition to the datapath synthesizer 122, which is typically a component of the HDL synthesizer 142. The datapath synthesizer 122 then implements datapath netlists using datapath cells from the architecture library 126. The architecture library can include one or more libraries, such as a bit-sliced datapath library, a built-in architecture library or several user-defined architecture libraries. The HDL synthesizer 142 then produces a top-level netlist which implements the remaining random logic part and instantiates the datapath netlists. The top-level netlist represents the netlist for the IC 30 of FIGS. 1 and 2b, and is preferably a hierarchical netlist which instantiates several datapath netlists at different parts of the hierarchy, as is well-known to those skilled in the art. The top-level netlist and the datapath netlist are provided to the logic optimizer 152, which optimizes the random logic part of the netlist using well-known gate-level logic optimization methods, i.e., without using alternative datapath cells for optimizing the timing of the circuit.

It should be noted that the pre-characterizer 120 of FIG. 10 is missing in the embodiment of FIG. 12. The system of FIG. 12 does not characterize the timing of any matched datapath cells before a netlist is synthesized. In contrast, the system of FIG. 10 characterizes the timing of all matched datapath cell entries before a netlist is synthesized.

Logic optimizer 152 produces an optimized netlist, which is received by datapath resynthesizer 172. Datapath resynthesizer 172 creates a new datapath netlist optimized in accordance with user constraints 144. To accomplish this optimization, resynthesizer 172 accesses datapath characterizer 192, which is similar to datapath characterizer and query database manager 124 shown in FIG. 6 except that the system does not write a query database 128 and timing database 134. Datapath resynthesizer 172 preferably processes only those datapath cell instances in the netlist which have timing problems. For each datapath cell instance with timing problems, the datapath resynthesizer preferably provides one alternative matched datapath cell at a time from the list of alternative matched cells to datapath characterizer 192. Characterizer 192 provides a datapath specification netlist to netlist compiler 130. Netlist compiler 130 operates as described with reference to FIG. 6. A compiled netlist is provided from compiler 130 to timing verifier 194, which is similar to the timing verifier and database management tool 132 of FIG. 6 except that no database management tool is necessary.

Timing verifier 194 provides the pin-to-pin timing information of the alternative matched datapath cell to datapath characterizer 192, which provides this same information to datapath resynthesizer 172. Resynthesizer 172 computes the timing slacks for the alternative matched datapath cell instance in accordance with user constraints 144 by using timing verification methods which are well-known to those skilled in the art. If the timing performance improves, the new netlist is retained; otherwise, the previous netlist is retained for further processing. The datapath synthesizer 172 preferably examines several alternative cells from the list of alternative matched datapath cells, one at a time, and keeps the best alternative cell instance in the datapath netlist that improves the timing performance of the netlist.

If timing problems (or other problems specified by user constraints) continue using the resynthesized netlist, datapath resynthesizer preferably selects another datapath cell instance with timing problems and resynthesizes that portion of the netlist using the method described above. When further timing improvement is not feasible, the datapath synthesizer 172 provides the resynthesized netlist to the logic optimizer 174, as described above with reference to FIG. 10. Optimizer 174 optimizes the gate-level netlist according to the user constraints 144 and produces a final optimized netlist 176 to be used in producing an integrated circuit 30 as shown in FIG. 1.

Similar to the embodiment described above with reference to FIG. 8, the embodiment 190 of FIG. 12 can use either datapath cells and a datapath compiler to produce a compiled netlist for timing verifier 194 or built-in and user-defined architectures and an architecture compiler to produce a compiled netlist for the verifier 194.

The user can specify timing constraints in the user constraints 144 so that datapath resynthesizer 172 synthesizes a netlist according to such constraints. For example, a user might constrain the input-to-output timing of a circuit to be less than 3 nanoseconds. In addition, characterization of alternative matched datapath cells is performed on demand during the datapath resynthesis process. Note that in a demand-driven mode, datapath timing characterization is performed only for datapath cell instances in the netlist which have timing problems, thereby saving significant processing time for datapath cell characterizations.

For example, if there are 100 datapath operators, such as adders, subtracters, and multipliers, in an HDL description, datapath synthesizer 122 would create a datapath netlist with 100 datapath cell instances. Each datapath cell might be selected as a high-density (low speed) cell. The datapath resynthesizer 172 calculates the timing slacks and determines that, for example, five of the 100 datapath cell instances in the netlist have timing problems. Resynthesizer 172 may then decide to resynthesize only these five instances with pin-compatible alternative datapath cells. As a result, resynthesizer 172 provides only a small number of alternative matched datapath cells, one at a time, to datapath characterizer 192 for computing the timing characteristics. In the pre-characterization embodiment of FIG. 10, however, the pre-characterizer exhaustively characterizes all the matched datapath cell entries for the 100 datapath operators at the expense of characterization time and stores data in the query and timing databases. The datapath resynthesizer 172 will later find that only five datapath cell instances in the netlist have timing problems. Thus, only the timing information for these five datapath cell instances will be accessed and used in the datapath optimization process.

It should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. A method for fabricating an integrated circuit, the method comprising the steps of:
   developing a set of circuit specifications for an integrated circuit;
   encoding said set of circuit specifications in a hardware description language description and inputting said hardware description language description into a digital computer;
   providing a datapath library including datapath cells, each of said datapath cells comprising a plurality of primitive cells;
   synthesizing from said hardware description language description and on said computer a netlist including said datapath cells of said datapath library;
   resynthesizing and optimizing said netlist according to timing information describing timing characteristics of an alternative datapath cell that replaces one of said datapath cells in said netlist;
   fabricating an integrated circuit as specified by said resynthesized netlist.

2. A method as recited in claim 1 wherein said step of resynthesizing and optimizing said netlist includes retrieving said timing information for said alternative datapath cells from a timing database.

3. A method as recited in claim 2 further including a step of preprocessing a timing database, said preprocessing step comprising steps of:
   synthesizing from said hardware description language description a netlist including said datapath cells of said datapath library after said step of providing a datapath library;
   calculating timing information describing the timing characteristics each of said datapath cells used in said netlist; and
   storing said timing information in a timing database to be accessed in said resynthesis step.

4. A method as recited in claim 3 further comprising a step of storing an indication in a query database that timing information of a datapath cell has been stored in said timing database.

5. A method as recited in claim 4 wherein said indication includes a record having an identification of said datapath cell and a location in said timing database where said timing information is stored.

6. A method as recited in claim 4 further comprising a step of checking for match between a record in said query database and a datapath cell, wherein when match is found, said timing information for said datapath cell is not calculated and is not stored in said timing database.

7. A method as recited in claim 3 further comprising a step of compiling said netlist before said step of calculating said timing information for said datapath cells.

8. A method as recited in claim 1 wherein said step of resynthesizing and optimizing said netlist is accomplished a plurality of times in an iterative loop to optimize said netlist according to constraints.

9. A method as recited in claim 1 further comprising a step of calculating timing information describing the timing characteristics of each of said datapath cells used in said netlist and using said timing characteristics in said resynthesis and optimizing step.

10. A method as recited in claim 9 wherein said step of calculating timing characteristics for said datapath cells includes matching a datapath cell in said netlist to all available datapath cells in said datapath library and calculating timing characteristics for each of said available datapath cells.

11. A method as recited in claim 10 wherein said step of fabricating an integrated circuit comprises:
  producing IC mask specifications based upon said resynthesized netlist;
  producing a plurality of IC masks from said mask specifications; and
  using said plurality of IC masks to fabricate said integrated circuit.

12. A method as recited in claim 10 wherein said steps of synthesizing and resynthesizing include creating a netlist according to optimization criteria.

13. An apparatus for fabricating an integrated circuit comprising:
  a digital processor;
  memory coupled to said digital processor;
  a datapath synthesizer for retrieving datapath operators from an input hardware description language description and synthesizing a netlist including datapath cells for implementing said datapath operators, each of said data path cells comprising a plurality of primitive cells;
  a datapath characterizer for providing timing characteristics of datapath cells; and
  a datapath resynthesizer for resynthesizing said netlist into a final netlist according to timing characteristics of alternative datapath cells that replace said datapath cells in said netlist, said timing characteristics being retrieved from said datapath characterizer, wherein said final netlist is used in said fabrication of said integrated circuit.

14. An apparatus as recited in claim 13 wherein said datapath characterizer is part of a pre-characterizer for storing timing information of datapath cells.

15. An apparatus as recited in claim 14 wherein said pre-characterizer further includes a timing database to store said timing characteristics of said alternative datapath cells, wherein said datapath characterizer retrieves said timing characteristics from said timing database.

16. An apparatus as recited in claim 14 wherein said pre-characterizer further includes a timing verifier for determining said timing characteristics of said alternative datapath cells and storing said timing characteristics in said timing database.

17. An apparatus as recited in claim 16 further comprising a netlist compiler in said pre-characterizer for compiling said datapath netlists and providing a compiled datapath netlist to said timing verifier.

18. An apparatus as recited in claim 17 wherein said netlist compiler is a datapath compiler.

19. An apparatus as recited in claim 17 wherein said netlist compiler is an architecture compiler.

20. An apparatus as recited in claim 18 further comprising a query database in said pre-characterizer for storing an indication of whether timing information for each of said alternative datapath cells has been stored in said timing database.

21. An apparatus as recited in claim 20 wherein said indication includes a record including fields for storing an identification of a datapath cell and a location of timing characteristics for said datapath cell in said timing database.

22. An apparatus as recited in claim 13 further comprising a timing verifier for receiving said netlist from said datapath synthesizer and for determining the timing characteristics of said alternative datapath cells.

23. An apparatus as recited in claim 22 wherein said datapath resynthesizer provides said alternative datapath cells one at a time to said datapath characterizer to determine said timing characteristics of said provided alternative datapath cell.

24. An apparatus as recited in claim 23 further comprising a netlist compiler for receiving said netlist from said datapath characterizer and for providing a compiled netlist to said timing verifier.

25. An apparatus as recited in claim 24 further comprising a logic optimizer for optimizing said resynthesized netlist according to user constraints including circuit delay constraints.

26. A method for providing timing characteristics of datapath cells retrieved from a datapath library, the method including the steps of:
  providing a datapath library including datapath cells, each of said datapath cells comprising a plurality of primitive cells;
  developing a set of circuit specifications for an integrated circuit;
  encoding said set of circuit specifications in a hardware description language description;
  matching datapath operators in said hardware description language description to datapath cells stored in a library;
  determining timing characteristics of each of said matched datapath cells; and
  storing said timing characteristics of said matched datapath cells in a timing database.

27. A method as recited in claim 26 wherein said step of determining timing characteristics is accomplished for a matched datapath cell only when said timing characteristics for said matched datapath cell have not been previously calculated.

28. A method as recited in claim 27 wherein said step of determining timing characteristics is accomplished by examining a query database to determine when timing characteristics of a datapath cell have previously been stored.

29. A method as recited in claim 28 further comprising synthesizing a netlist for each of said matched datapath cells before said step of determining said timing characteristics.

30. A method as recited in claim 29 further comprising a step of compiling said netlists of said datapath cells before said step of determining said timing characteristics.

31. A method as recited in claim 28 further comprising a step of updating said query database with an indication that timing characteristics for at least one datapath cell have been stored in said timing database.

32. A method as recited in claim 30 wherein said indication includes storing an identification of a datapath cell and the location in said timing database where said timing characteristics for said identified datapath cell can be found.

33. A computer readable medium including program instructions for fabricating an integrated circuit, the program instructions performing steps comprising:
  developing a set of circuit specifications for an integrated circuit;
  encoding said set of circuit specifications in a hardware description language description and inputting said hardware description language description into a digital computer;
  providing a datapath library including datapath cells, each of said datapath cells comprising a netlist of primitive cells;
  synthesizing from said hardware description language description and on said computer a netlist including said datapath cells of said datapath library;
  resynthesizing and optimizing said netlist according to timing information describing timing characteristics of an alternative datapath cell that replaces one of said datapath cells in said netlist; and providing said resynthesized netlist for fabrication of an integrated circuit as specified by said resynthesized netlist.

34. A computer readable medium as recited in claim 33 wherein said step of resynthesizing and optimizing said netlist includes retrieving said timing information for said alternative datapath cells from a timing database, and further including a step of preprocessing a timing database, said preprocessing step comprising steps of:

synthesizing from said hardware description language description a netlist including said datapath cells of said datapath library after said step of providing a datapath library;

calculating timing information describing the timing characteristics of each of said datapath cells used in said netlist; and storing said timing information in a timing database to be accessed in said resynthesis step.

35. A computer readable medium as recited in claim 34 further comprising steps of:

storing an indication in a query database that timing information of a datapath cell has been stored in said timing database; and checking for match between a record in said query database and a datapath cell, wherein when match is found, said timing information for said datapath cell is not calculated and is not stored in said timing database.

36. A computer readable medium as recited in claim 33 further comprising a step of calculating timing information describing the timing characteristics of each of said datapath cells used in said netlist and using said timing characteristics in said resynthesis and optimizing step, wherein said calculating timing characteristics for said datapath cells includes matching a datapath cell in said netlist to all available datapath cells in said datapath library and calculating timing characteristics for each of said available datapath cells.

37. A computer readable medium as recited in claim 33 wherein said steps of synthesizing and resynthesizing include creating a netlist according to optimization criteria.

* * * * *

UNITED STATES PATENT AND TRADEMARK OFFICE
CERTIFICATE OF CORRECTION

PATENT NO. : 5,726,902
DATED : March 10, 1998
INVENTOR(S) : Mahmood et al.

It is certified that error appears in the above-indentified patent and that said Letters Patent is hereby corrected as shown below:

Column 22, line 34, after "characteristics", insert --of--

Column 23, line 20, change "data path" to --datapath--

Column 23, line 21, after the paragraph that ends in "a plurality of primitive cells;", insert additional paragraph:--a datapath library stored in said memory for providing said datapath cells to said datapath synthesizer;--

Signed and Sealed this

Ninth Day of March, 1999

Attest:

Q. TODD DICKINSON

Attesting Officer

Acting Commissioner of Patents and Trademarks